United States Patent
Hsu

(10) Patent No.: US 10,242,743 B2
(45) Date of Patent: Mar. 26, 2019

(54) METHOD AND APPARATUS FOR WRITING NONVOLATILE MEMORY USING MULTIPLE-PAGE PROGRAMMING

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 0 days.

(21) Appl. No.: 14/846,673

(22) Filed: Sep. 4, 2015

(65) Prior Publication Data

US 2016/0071599 A1    Mar. 10, 2016

Related U.S. Application Data

(60) Provisional application No. 62/046,902, filed on Sep. 6, 2014.

(51) Int. Cl.

| | | |
|---|---|---|
| *G11C 16/10* | (2006.01) | |
| *G11C 16/32* | (2006.01) | |
| *G11C 16/08* | (2006.01) | |
| *G11C 16/16* | (2006.01) | |
| G11C 7/10 | (2006.01) | |

(52) U.S. Cl.
CPC .............. *G11C 16/10* (2013.01); *G11C 16/08* (2013.01); *G11C 16/16* (2013.01); *G11C 16/32* (2013.01); *G11C 7/1039* (2013.01)

(58) Field of Classification Search
CPC ...... G11C 16/0483; G11C 16/10; G11C 16/08
USPC ........................... 365/185.12, 185.17, 185.11
See application file for complete search history.

(56) References Cited

U.S. PATENT DOCUMENTS

| | | | |
|---|---|---|---|
| 6,064,622 A | 5/2000 | Lee et al. | |
| 6,175,523 B1 | 1/2001 | Yang et al. | |
| 6,687,158 B2 | 2/2004 | Yano | |
| 6,847,555 B2 * | 1/2005 | Toda ..................... | G11C 7/065 |
| | | | 365/185.03 |

(Continued)

FOREIGN PATENT DOCUMENTS

| | | |
|---|---|---|
| TW | I415138 B | 11/2013 |
| TW | 201419301 A | 5/2014 |

OTHER PUBLICATIONS

International Search Report, dated Feb. 2, 2016, for corresponding International Application No. PCT/US2015/048718.

(Continued)

*Primary Examiner* — Alexander Sofocleous
*Assistant Examiner* — Alfredo Bermudez Lozada
(74) *Attorney, Agent, or Firm* — Intellectual Property Law Group LLP

(57) ABSTRACT

A method of storing information or data in a nonvolatile memory device with multiple-page programming. The method, in one aspect, is able to activate a first drain select gate ("DSG") signal. After loading the first data from a bit line ("BL") to a nonvolatile memory page of a first memory block in response to activation of the first DSG signal during a first clock cycle, the first DSG signal is deactivated. Upon activating a second DSG signal, the second data is loaded from the BL to a nonvolatile memory page of a second memory block. The first data and the second data are simultaneously written to the first memory block and the second memory block, respectively.

17 Claims, 16 Drawing Sheets

(56) References Cited

U.S. PATENT DOCUMENTS

| | | |
|---|---|---|
| 7,110,301 B2 | 9/2006 | Lee et al. |
| 7,257,027 B2 | 8/2007 | Park |
| 7,359,248 B2 | 4/2008 | Chen et al. |
| 8,089,815 B2 | 1/2012 | Li et al. |
| 8,310,872 B2 * | 11/2012 | Koya ................. G11C 16/0483 365/185.09 |
| 8,331,146 B2 | 12/2012 | Fukuda |
| 2006/0018158 A1 * | 1/2006 | Jo .......................... G11C 16/16 365/185.11 |
| 2014/0040571 A1 | 2/2014 | Pilolli et al. |

OTHER PUBLICATIONS

Written Opinion of the International Searching Authority, dated Feb. 2, 2016, for corresponding International Application No. PCT/US2015/048718.

Taiwan Search Report and Office Action, dated Jul. 21, 2016, for corresponding Taiwan Application No. 104129437 with English translation.

* cited by examiner

METHOD AND APPARATUS FOR WRITING NONVOLATILE MEMORY USING MULTIPLE-PAGE PROGRAMMING

PRIORITY

This application claims the benefit of priority based upon U.S. Provisional Patent Application Ser. No. 62/046,902, filed on date Sep. 6, 2014 and entitled "NAND flash memory with multiple-page programming," which is hereby incorporated herein by reference in its entirety.

FIELD OF THE INVENTION

The exemplary embodiment(s) of the present invention relates to the field of semiconductor and integrated circuits. More specifically, the exemplary embodiment(s) of the present invention relates to nonvolatile memory devices.

BACKGROUND OF THE INVENTION

Nonvolatile memory, such as NAND or NOR based flash memory, is widely used in today's technology world. Its unique cell and array structure provide a small cell size, high density, low write current, and higher data throughout. Nonvolatile memory such as NAND based flash memory becomes major storage memory for various devices and systems, such as memory cards, USB flash drives, and solid-state drives. Some exemplary applications of flash memory include personal computers, PDAs, digital audio players, digital cameras, mobile phones, synthesizers, video games, scientific instrumentation, industrial robotics, and medical electronics. NAND flash memory technology, for example, has reached 16 nanometers ("nm"), and its single-chip density can reach 128 gigabit ("Gb") storage capacity.

A problem, however, associated with conventional NAND based flash memory is that it has a relatively slow programming speed. A reason for a slow programming speed and/or erasing speed is that a conventional NAND flash memory performs single-page programming. For some applications, a slow programming and/or erasing speed in a nonvolatile memory storage becomes a limitation and/or drawback.

SUMMARY

A method of storing information or data in a nonvolatile memory device with multiple-page programming is disclosed. The method, in one aspect, is able to activate a first drain select gate ("DSG") signal. After loading the first data from a bit line ("BL") to a nonvolatile memory page of a first memory block in response to activation of the first DSG signal during a first clock cycle, the first DSG signal is deactivated. Upon activating a second DSG signal, the second data is loaded from the BL to a nonvolatile memory page of a second memory block. The first data and the second data are simultaneously written to the first memory block and the second memory block, respectively.

Additional features and benefits of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
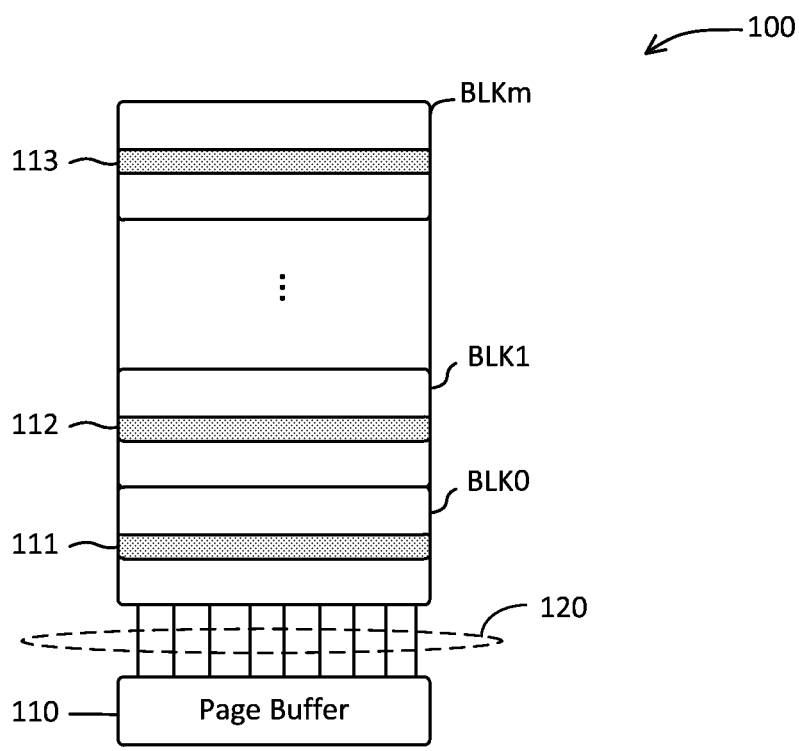
FIG. 1 is a block diagram illustrating a nonvolatile memory array 100 capable of programming multiple pages simultaneously in accordance with one embodiment of the present invention.

Exemplary embodiment(s) of the present invention is described herein in the context of a method, device, and apparatus for writing nonvolatile flash memory using multiple-page programming.

Those of ordinary skilled in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general purpose machines. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Those of ordinary skills in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skills in the art. Such persons of ordinary skills in the art will now also realize that a range of doping concentrations around those described above will also work. Essentially, any process capable of forming pFETs and nFETs will work. Doped regions may be diffusions or they may be implanted.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processors and systems, control logic, ASICs, chips, workstations, mainframes, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to the block and flow diagrams, are typically performed in a different serial or parallel ordering and/or by different components and/or over different connections in various embodiments in keeping within the scope and spirit of the invention.

One embodiment of the present invention discloses a method of storing information in a nonvolatile memory device and system. The method, in one aspect, includes activating a first drain select gate ("DSG") signal, loading first data from a bit line ("BL") to a nonvolatile memory page of a first memory block in response to activation of the first DSG signal during a first clock cycle, deactivating the first DSG signal and activating a second DSG signal, loading second data from the BL to a nonvolatile memory page, and writing the second data to a nonvolatile memory cell in the nonvolatile memory page of the second memory block. The method functions to load multiple pages of data into different blocks and then programs multiple selected word lines simultaneously. The system can include an array of flash memory cells, a set of bit lines, a set of word lines and multiple block decoders coupled to multiple blocks.

FIG. 1 is a block diagram illustrating a nonvolatile memory array 100 capable of programming multiple pages simultaneously in accordance with one embodiment of the present invention. The array 100 includes a page buffer 110 and multiple blocks, such as block 0 ("BLK0"), block 1 ("BLK1"), and block m ("BLKm"). Each block of memory is further arranged into multiple memory pages. The nonvolatile memory, in one aspect, can be NAND based flash memory, NOR based flashed memory, phase-changing memory ("PCM"), EEPROM (erasable programmable read-only memory), or a combination of NAND, NOR, PCM, and/or EEPROM memory. To simplify forgoing discussion, NAND based flash memory is used as an exemplary nonvolatile memory throughout the specification. It should be noted that the underlying concept of the exemplary embodiment(s) of the present invention would not change if one or more blocks (or devices) were added to or removed from diagram 100.

The NAND flash memory array, for example, is organized with multiple memory blocks wherein each block is further divided into multiple pages. An exemplary NAND flash memory array includes 32 to 256 blocks of memory wherein each page has a range from 16 kilobit ("Kb") to 256 Kb of memory space. During an erase cycle, the NAND flash memory resets one block memory at one time. For example, the flash memory sets nonvolatile memory cells of a block to a clean state such as all cells are set to logic "1". NAND flash memory based on Floating Gate (FG) technology, Silicon-Oxide-Nitride-Oxide-Silicon (SONOS) technology, or any other Charge-Trapping technology. The memory, in one example, can be configured in two-dimensional (2D) and/or three-dimensional (3D) array structure. During a write or program cycle, the NAND flash memory writes or programs one page at a time. It should be noted that the programming cycle and erasing cycle are generally slow comparing with logic operations. For example, the block-erase operation and/or the page-program operation can take anywhere from 0.5 to 2 milliseconds ("ms"). During writing and easing operations, the NAND flash memory uses relatively high voltages such as 18-20V to erase and/or to program the NAND flash memory cells. The speed of erasing and/or programming nonvolatile memory cell may vary depending on the variation of voltages. It should be noted that higher voltage can degrade device performance which often results in low endurance cycles.

Referring back to FIG. 1, a nonvolatile memory device which contains a NAND flash memory array 100 includes an array of flash memory cells organized in multiple blocks such as BLK0-BLKm, a set of bit lines ("BLs") 120, and page buffer 110. Each block is further arranged pages such as pages such as pages 111 or 113. The set of BLs are used to couple between the multiple blocks and the page buffer 110. In one example, BLs are used to load data from the page buffer 110 to flash memory cells in one or more pages within one or more blocks such as page 112 of block BLK1.

The NAND flash memory array 100 further includes a set of word lines ("WLs") and one or more block decoders, not shown in FIG. 1. WLs are used to couple to the pages for addressing where the data should be stored in the flash memory cell(s). The block decoders which are coupled to the blocks wherein multiple block decoders can be activated concurrently to write the data to multiple pages situated in different blocks during an operation of multiple-page programming scheme ("MPS").

During the MPS operation, the first set of data in the page 110, for example, is loaded into page 111 of block BLK0 via BLs 120 during a first clock cycle. Once the first data is present in page 111, the WLs are activated during a second clock cycle. A process of programming flash memory cells in page 111 subsequently begins in accordance with the first data. When the first data is trapped in the page 111, the connections between BLs 120 and the page 111 are switched off during a third clock cycle. The connections between BLs 120 and the page 112 of block BLK1 are subsequently switched on, and the second data in the page 110 is loaded into the page 112 at the following clock cycle. As soon as the second data is present in the page 112, the WLs are activated and a process of programming flash memory cells in the page 112 in accordance with the second data begins. Once the second data is trapped in the page 112, the connections between BLs 120 and the page 112 is deactivated. During the MPS operation, multiple pages within different blocks can be programmed concurrently.

An advantage of using MPS is that the MPS is capable of writing or programming multiple pages in different blocks concurrently whereby the overall programming speed is enhanced. For instance, the MPS writes/programs the multiple pages 111-113 simultaneously whereby the overall writing/programming time is shortened. It should be noted that the MPS within the NAND flash memory array 100 can be used in computing systems, network devices, personal computers ("PCs"), tablets, smart phones, servers, mainframes, routers, switches, and the like.

Figure 2:
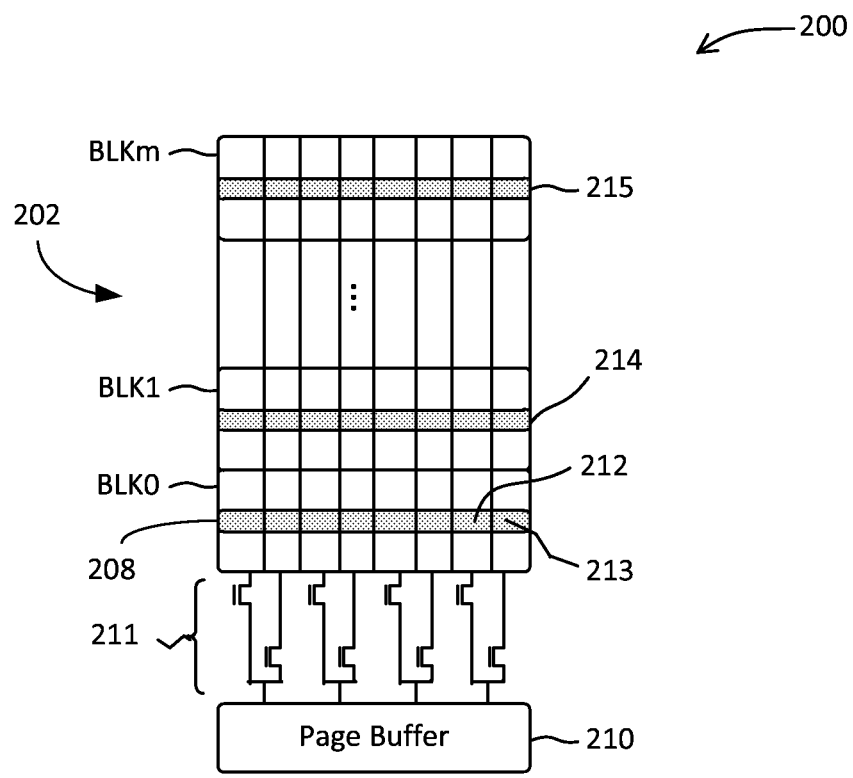
FIG. 2 is a block diagram illustrating nonvolatile memory device able to program and/or erase multiple half pages at a given time in accordance with one embodiment of the present invention.

FIG. 2 is a block diagram 200 illustrating nonvolatile memory device able to program and/or erase multiple half pages at a given time in accordance with one embodiment of the present invention. Diagram 200 includes a nonvolatile memory array 202, a selection switch 211, and a page buffer 210. The nonvolatile memory array, in one embodiment, is an NAND flash array having multiple blocks such as BLK0-BLKm. It should be noted that the underlying concept of the exemplary embodiment(s) of the present invention would not change if one or more blocks (or devices) were added to or removed from diagram 200.

In one aspect, the NAND flash array 202 is designed so that a data loading scheme operates the page buffer 210 to load different data to the two half-pages 212, 213 through the selection switch 211. The selection switch 211 which includes at least two transistors controls the time and the data to be written to selected pages or half pages. Alternatively, the switch 211 can have more than two sets of switches, such as 4 or 8 for example, to perform ¼ or ⅛ page programming. Note that writing or programming multiple half-pages in different blocks simultaneously or concurrently can improve overall writing/programming speed.

During an MPS, the first set of data in the page 210, for example, is loaded into page 208 of block BLK0 via selection switch 211 which controls BLs. Once the first data is present at page 208, various WLs are activated and a process of programming flash memory cells in page 208 begins. When the first data is trapped in the page 208, the connections between the page buffer 210 and page 208 are switched off. The connections between page buffer 210 and the page 214 of block BLK1 are subsequently switched on. The second data at the page buffer 210 is loaded into the page 214. When the second data is present in the page 214, the WLs are activated and a process of programming flash memory cells in the page 214 begins while the programming process to page 208 is still active. Once the second data is trapped in the page 214, the connections between buffer page 210 and the page 214 is deactivated. During the MPS, multiple pages within different blocks are programmed concurrently.

Figure 3:
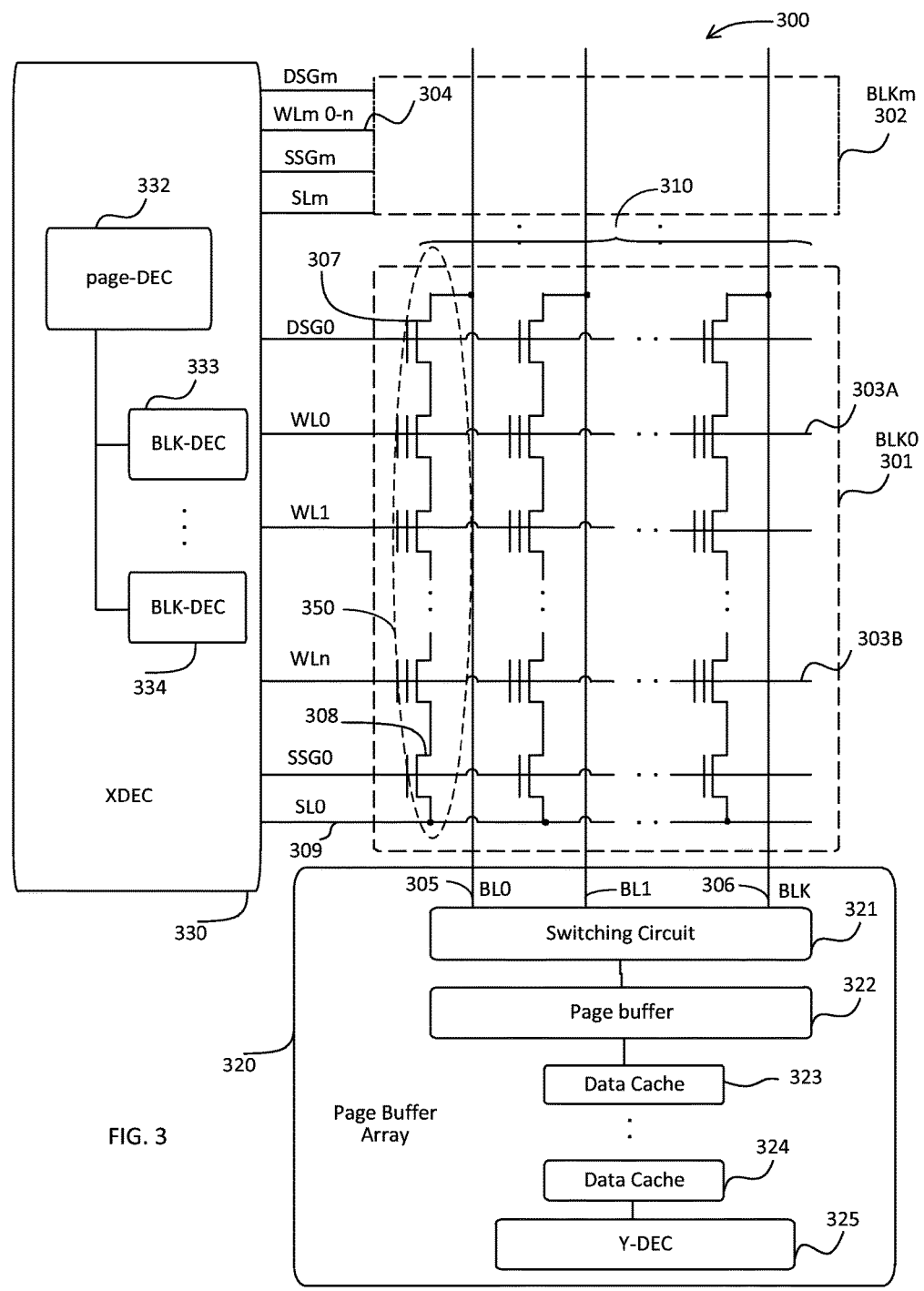
FIG. 3 is a block diagram illustrating a layout of a NAND flash memory array able to provide a multiple-page programming scheme in accordance with one embodiment of the present invention.

FIG. 3 is a block diagram illustrating a layout of a NAND flash memory array 300 able to provide a multiple-page programming scheme in accordance with one embodiment of the present invention. The array 300 includes multiple blocks 301 (BLK0)-302 (BLKm), word lines 303 (WL0:0-n)-304 (WLm:0-n), bit lines 305 (BL0)-306 (BLk), a page buffer array 320, and an X-decoder 330. It should be noted that the underlying concept of the exemplary embodiment(s) of the present invention would not change if one or more blocks (or components) were added to or removed from the NAND flash memory array 300.

In one embodiment, each block 301 (BLK0) or 302 (BLKm) includes multiple cells or cell strings 310 organized in a set of serial strings. Each block 301 (BLK0)-302 (BLKm) can include multiple word lines 303A (WL0)-303B (WLm). The gates or transistors of the cell strings 310 are connected to the word lines 303A (WL0)-303B (WLm). The cell strings 310, for example, connect to the bit lines 305 (BL0)-306 (BLk) through a drain select gate (DSG) such as DSG 107. The cell string 310 also connects to a source line (SL) through a source select gate, SL 309 and SSG 308.

The page buffer array 320 includes a switching circuit 321, a page buffer 322, multiple data caches 323-324, and Y-decoder 325. The bit lines 305 (BL0)-306 (BLk) are connected to the switching circuit 321. The switching circuit 321 can choose a portion of bit lines 305 (BL0)-306 (BLk) to connect to the page buffer 322. In an alternative embodiment, the page buffer array 320 does not include the switching circuit 321. For example, the entire bit lines 305 (BL0)-306 (BLk) can connect to the page buffer 322.

The data caches 323-324, in one aspect, are used for page buffer backups. For example, to setup MPS, loading data to each page of a block is carried out quickly whereby a set of caches can be helpful to reload page buffer quickly for each page. It should be noted that the cache can be static random-access memory ("SRAM") based, or dynamic random-access memory ("DRAM") based memory device.

The X-decoder 330 (also called XDEC, WL-decoder or row-decoder) includes a page decoder 332 and multiple block decoders 333-334. In an embodiment, the word lines 303 (WL0:0-n)-304 (WLm:0-n), the drain select gates DSG0-DSGm, the source select gates SSG0-SSGm, and the source lines SL0-SLm all connect to the X-decoder 330. In an alternative embodiment, the source lines SL0-SLm of each block BLK0-BLKm can be connected in common. In yet another embodiment, the source select gates SSG0-SSGm of each block BLK0-BLKm can be connected in common.

In one embodiment, a nonvolatile memory device 300 includes an array of NAND bases flash memory cells, BLs 305-306, WLs 303-304, and multiple block decoders 333-334. The array of flash memory cells organized in multiple blocks 301-302, wherein each of the multiple blocks is further arranged in pages such as page 350. The blocks, in one example, are arranged in arrays wherein each block contains a set of flash memory cell strings. Each string, in one aspect, is a page. The flash memory cells can be NAND based flash memory cells. Alternatively, the flash memory cells are p-channel metal-oxide-semiconductor ("PMOS") based flash memory cells.

BLs are coupled to the blocks 301-302 configured to provide data to at least a portion of flash memory cells across the blocks. A set of WLs are used to facilitate addressing at least a portion of the flash memory cells. The block decoders such as block decoders 333-334 are coupled to the blocks 301-304 wherein each of the block decoders are assigned to a corresponding block for block enablement. In one aspect, two or more the multiple block decoders 301-302 are able to simultaneously turn on multiple word lines in multiple blocks during the MPS. The page decoder 332, in one embodiment, includes block decoder enable ("BDE") lines wherein each of the BDE lines is assigned to one of the block decoders 333-334 for driving the set of WLs. In one example, a BDE line can be activated independent from the other BDE lines. Multiple BDE lines can be activated at the same time during the MPS.

Each string of nonvolatile memory cells, in one embodiment, includes a capacitor, not shown in FIG. 3. The capacitor can be used to temporarily store trapped data for the MPS. In one aspect, to preserve data integrity for the trapped data or loaded data from the page buffer, a capacitor is added to the string of NAND based memory cell can prolong the data at the string whereby the data can be correctly written to the nonvolatile memory cells.

During the MPS, after activating DSG0, the data at BLs 305-306 is loaded from page buffer to a page in block 301. Once the data is present at the page channel or memory string such as string 350, the DSG0 is deactivated which logically disconnects the BLs 305-306 from block 301. While data in block 301 is being written into the nonvolatile memory cells, DSG1 is activated and the data at BLs 305-306 is loaded to a page in the next block such as block 1 BLK1, not shown in FIG. 3. As soon as the data is present at BLK1, the writing process begins while the writing process for block 301 is still going.

Alternatively, page buffer array 320 write multiple pages of data in different blocks in a sequence. After the data is trapped in the pages in the different blocks, WLs to the blocks are activated to begin the programming or writing phase simultaneously. The writing or programming speed improves 100% if two pages can be programmed at the same time.

Figure 4:
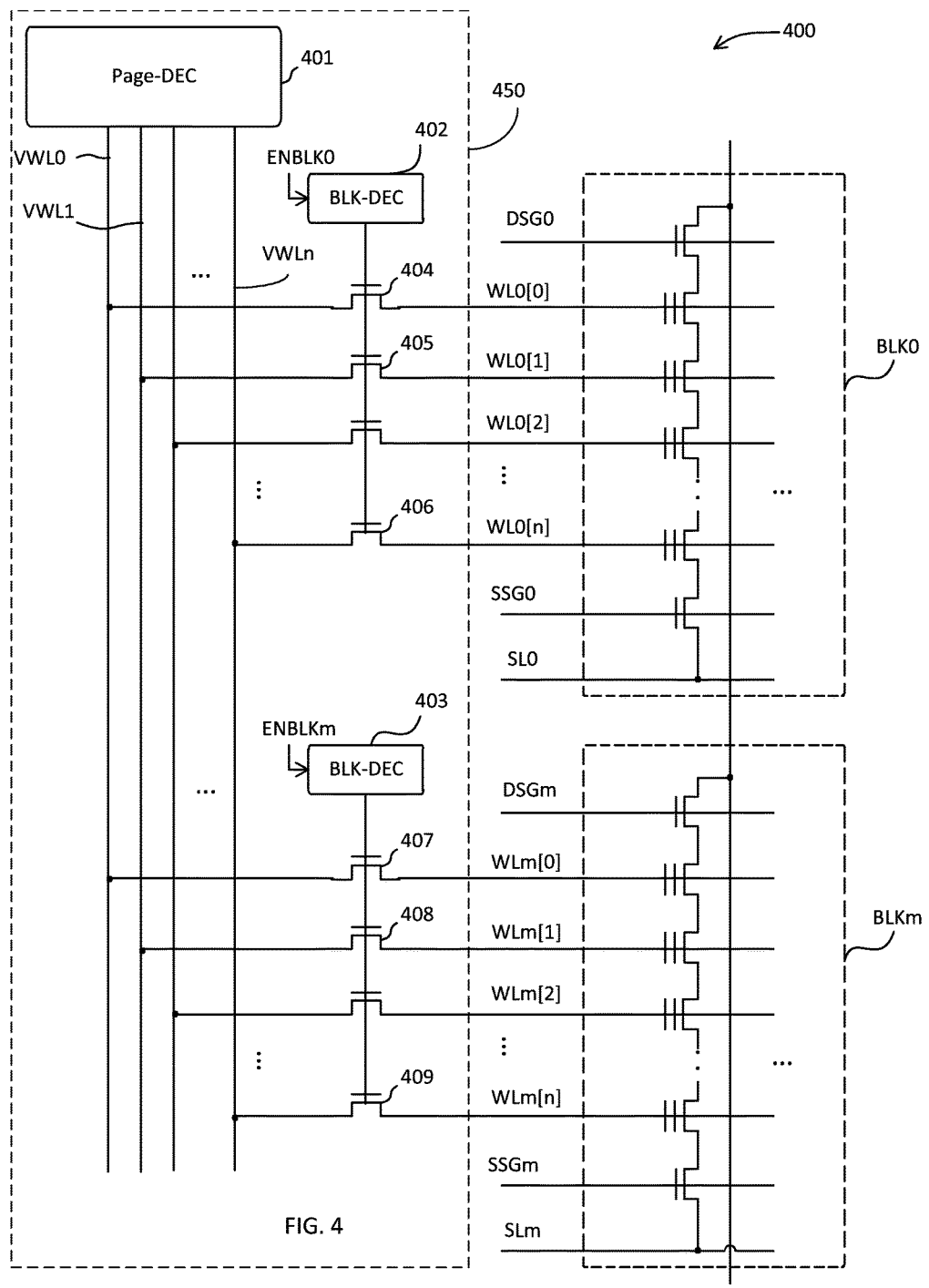
FIG. 4 is a block diagram illustrating a more detailed view of an X-decoder for addressing NAND flash memory array in accordance with one embodiment of the present invention.

FIG. 4 is a block diagram 400 illustrating a more detailed view of an X-decoder 450 for addressing a NAND flash memory array in accordance with one embodiment of the present invention. Diagram 400, which is similar to device 330 shown in FIG. 3, includes a page decoder 401, multiple block decoders 402-403, and multiple high voltage transistors 404-409. The multiple block decoders 402-403 are controlled or activated by a set of control signals ENBLK0-ENBLKm. ENBLK0 is referred to as Enabling Block Zero (0) and ENBLKm is referred to as Enabling Block m, where m can be any integers. Bus lines (or vertical world line) VWL0-VWLn of the page decoder 401 are coupled with the multiple high voltage transistors 404-409. The multiple high voltage transistors 404-409 are coupled with the word lines WL0-WLm of blocks BLK0-BLKm. It should be noted that the underlying concept of the exemplary embodiment(s) of the present invention would not change if one or more blocks (or components) were added to or removed from the diagram 400.

In one embodiment the multiple high voltage transistors 404-409 are NMOS high voltage transistors capable of handling high voltages such as 15 to 25 volts ("V") for programming and/or erasing data in the nonvolatile memory cells. The high voltage transistor 404-409 gates are also connected to a corresponding local block decoder 402-403 to pick and choose which memory cells need to be reprogrammed. While the source terminals of high voltage transistor 404-409 are connected to the bus lines VWL0-VWLn, the drain terminals of high voltage transistor 404-409 are connected to WLs of NAND flash memory array.

In an embodiment, the word lines (WL0:0-n)-(WLm:0-n), the drain select gates DSG0-DSGm, the source select gates SSG0-SSGm, and the source lines SL0-SLm are configured to connect to the X-decoder 400. Note that the letters "m" and "n" can be any integer numbers. In an alternative embodiment, the source lines SL0-SLm of each block BLK0-BLKm can be connected in common. In yet another embodiment, the source select gates SSG0-SSGm of each block BLK0-BLKm can be connected in common. Because the blocks such as BLK0-BLKm share the same page decoder 401, multiple selected word lines of the X-decoder 450 can be at the same location.

In another embodiment, the X-decoder 450 includes circuits to select different locations of the word line WL0-WLm in different blocks BLK0-BLKm. In an exemplary embodiment, each word line WL0-WLm can include a high voltage latch (not shown) or other circuit having a latch function. The high voltage latch (not shown) receives power supply from the block decoders 402-403. In an embodiment, the block decoders 402-403 can also include a high voltage latch (not shown). In operation, the local latch (not shown) and block latch (not shown) are set to a high or low voltage, also known as select or unselect voltage. The local latch provides a Vpgm (program voltage) or Vpass (pass voltage) signal to the word lines WL0-WLm of the selected block BLK0-BLKm, and/or provides 0V or floating to the unselected blocks BLK0-BLKm. The waveforms associated to the word lines WL0-WLm will be further discussed in FIG. 8-FIG. 11B.

A function of X-decoder 450 is to turn on multiple block decoders such BLK-Dec 402 and 403 concurrently to program data in multiple pages in different blocks during a multiple-page programming scheme ("MPS"). To erase or program nonvolatile memory cells in multiple pages and/or blocks, X-decoder 450, in one example, turns on selected pages and/or blocks and drives selected WLs to program voltages to multiple pages and/or blocks.

Figure 5:
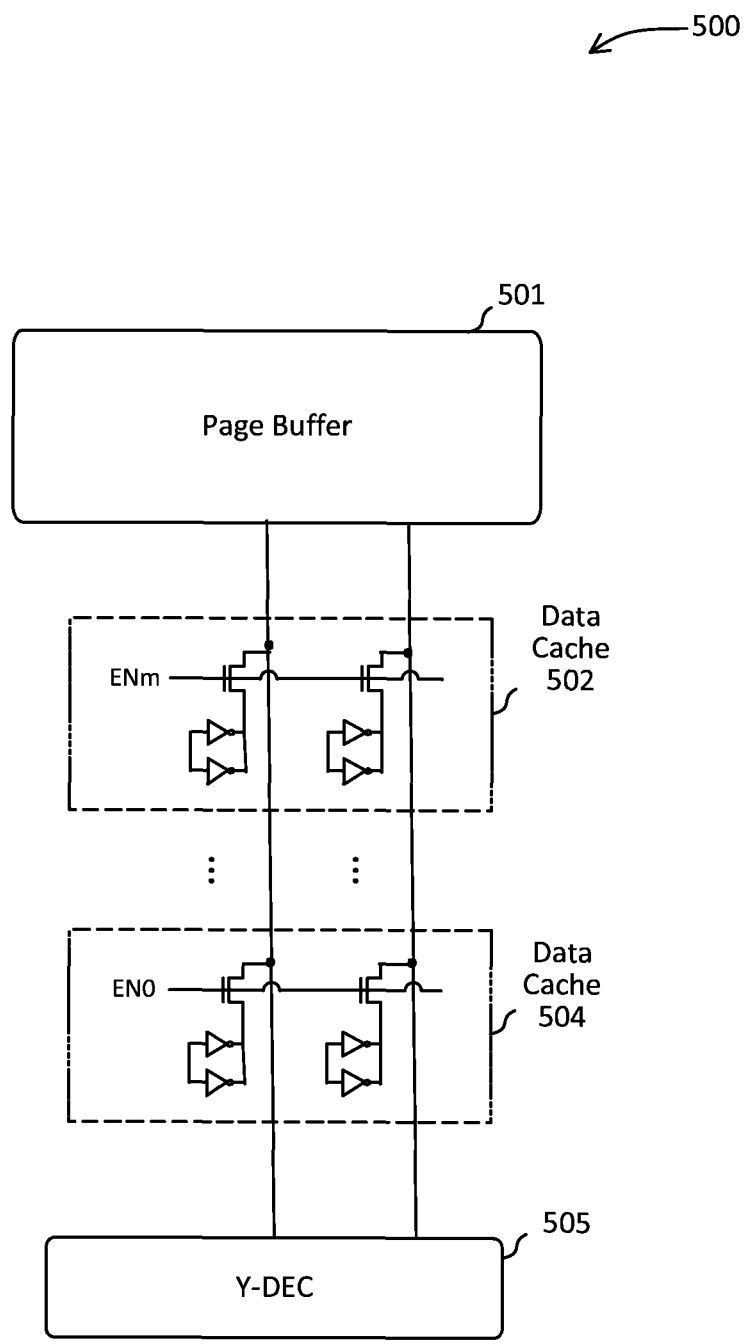
FIG. 5 is a block diagram illustrating an exemplary page buffer array in accordance with one embodiment of the present invention.

FIG. 5 is a block diagram 500 illustrating an exemplary page buffer array in accordance with one embodiment of the present invention. Diagram 500, which is similar to device 320 shown in FIG. 3, includes a page buffer 501, multiple data caches 502-503, and a Y-decoder 505. In an alternative embodiment, the page buffer array includes a switching circuit (not shown). While the inputs of page buffer 501 are coupled to the multiple data caches 502-503, the outputs of page buffer 501 are fed to a nonvolatile memory array. It should be noted that the underlying concept of the exemplary embodiment(s) of the present invention would not change if one or more blocks (or devices) were added to or removed from diagram 500.

The data caches 502-504, in one example, include latches or SRAM memory circuits to enhance storage capacity as well as faster replenishing data to page buffer 501. The multiple data caches 502-504 provide a reduced circuit area over using multiple full featured page buffers. The data caches 502-504 can be configured with various different types of memory circuitry, such as embedded SRAM, embedded DRAM, 1T-SRAM, and the like.

During the MPS operation, data stored in the data caches 502-503 can be transferred to the page buffer 501 page-by-page and then loaded into each selected block BLK0-BLKm as described herein. It should be noted that the operation time for page buffer 501 and data caches such as 502-503 are in nanoseconds ("ns") range while operation time for erase and write (program) data in nonvolatile memory cells are in milliseconds range. Since the trapped data at the NAND flash memory cell string can take hundreds milliseconds to dissipate, the page buffer 501 should have sufficient time to load multiple pages of data into different pages in different blocks before activating the programming cycle.

In an alternative embodiment, the page buffer array includes two or more page buffers 501 and/or data caches 502-504. The two or more groups of the page buffer 501 and data caches 502-504 can be located on top and bottom of the array, thereby relaxing the layout pitch. Alternatively, the data caches 502-504 can locate anywhere in the chip or die to feed multiple page data into the page buffer 501. Multiple data caches 502-504 can also be used to load the multiple page data to the selected blocks BLK0-BLKm for parallel programming as described herein. For example, the page buffer array includes a single-page buffer structure (not shown). An external system can continue loading multiple page data into the single-page buffer structure (not shown) and apply voltages signals to the selected block BLK0-BLKm page-by-page. Then the multiple-page programming for the multiply selected pages can begin as described herein.

During a program-verify phase, the data of the data caches 502-504 can be transferred to the single-page buffer structure (not shown) again, page-by-page. The corresponding word line WL0-WLm of the page is read by predetermined word line voltages to check a cell's Vt. The data is used to reset the single-page buffer structure (not shown) to the new data required for a next programming, and then the data is transferred back to the data caches 502-504 for the next program pulse.

Figure 6:
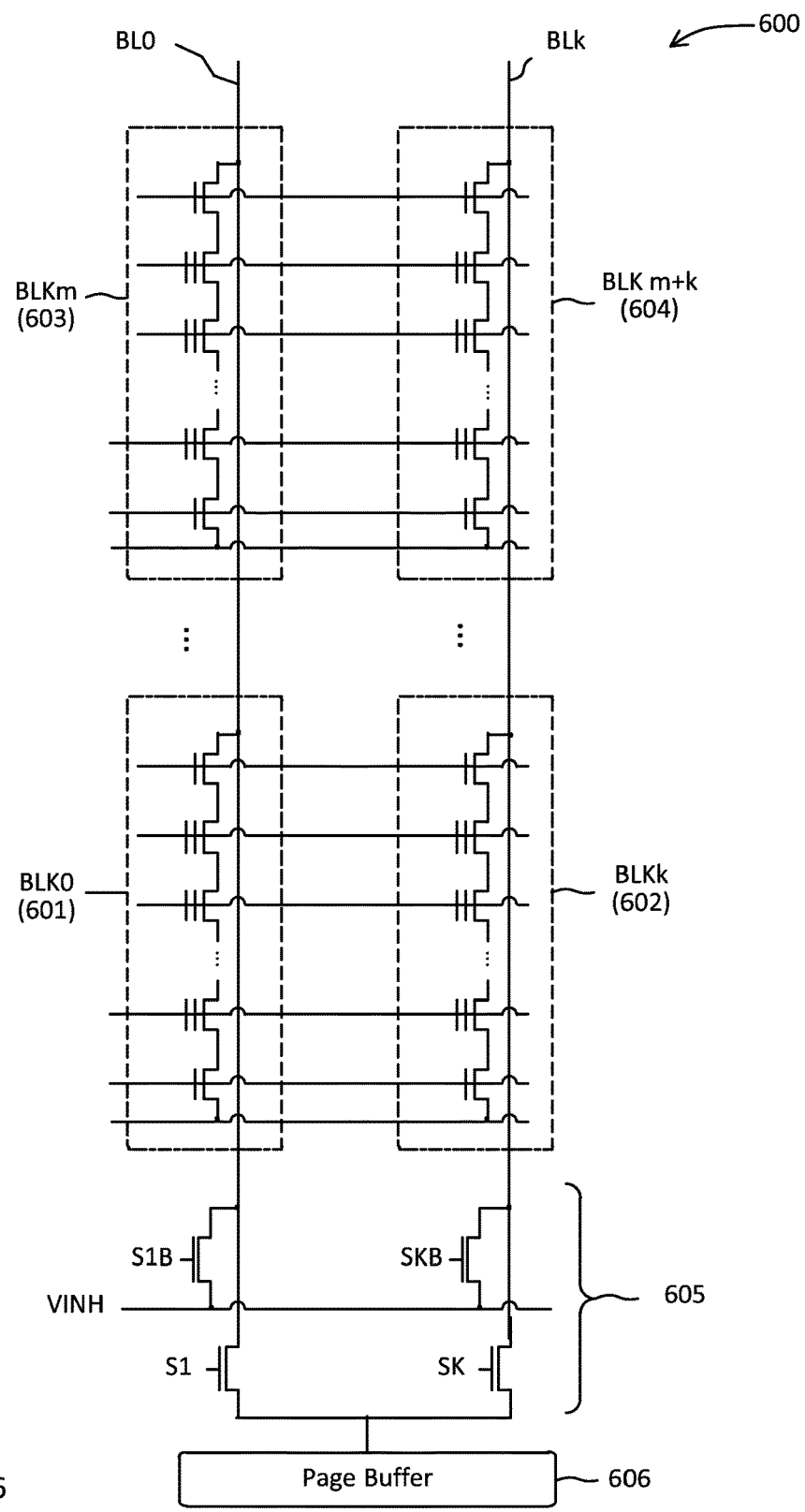
FIG. 6 is a block diagram 600 illustrating a NAND flash memory array for vertical blocks and horizontal blocks in accordance with one embodiment of the present invention.

FIG. 6 is a block diagram illustrating a NAND flash memory array 600 for vertical blocks and horizontal blocks in accordance with one embodiment of the present invention. The NAND flash memory array 600 provides a configuration of multiple blocks in both a horizontal direction and a vertical direction that can be loaded with different data and programmed simultaneously. The NAND flash memory array 600 includes blocks 601 (BLK0)-602 (BLKk), blocks 603 (BLKm)-604 (BLKm+k), switching circuit 605 and page buffer 606. The blocks 601 (BLK0)-602 (BLKk) are located in a vertical direction (bit line direction), whereas the blocks 603 (BLKm)-604 (BLKm+k) are located in the horizontal direction (word line direction). It should be noted that the underlying concept of the exemplary embodiment(s) of the present invention would not change if one or more blocks (or devices) were added to or removed from the array 600. The switching circuit 605 is configured to select one bit line from the multiple bit lines BL0-BLk to connect with the page buffer 606.

In operation, during writing/programming, bit line voltages to the cell strings of blocks 601 (BLK0)-602 (BLKk), and 603 (BLKm)-604 (BLKm+k) can be loaded. A selected bit line BL0-BLk can be applied with a 0V or VDD signal from the page buffer 606. The unselected bit lines BL0-BLk can be applied with an inhibit voltage signal such as VDD from a VINH bus. VDD can also be referred to as Vdd. After a DSG0 goes low to isolate the blocks 601 (BLK0)-602 (BLKk), the bit lines BL0-BLk can be applied with the next page of data and DSGm can be activated high to load bit line voltages into blocks 603 (BLKm)-604 (BLKm+k).

Figure 7:
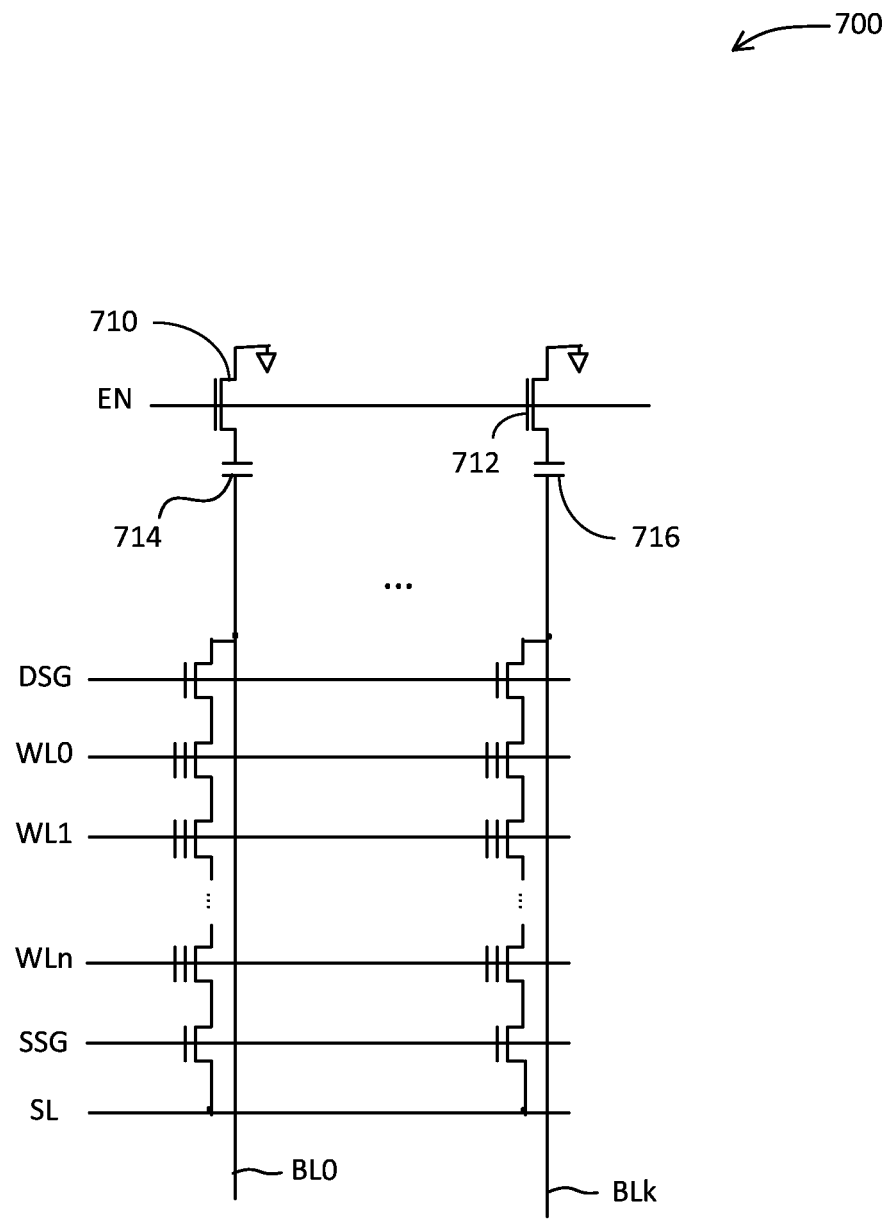
FIG. 7 is a block diagram illustrating an exemplary NAND flash memory array adding bit line capacitors in accordance with one embodiment of the present invention.

FIG. 7 is a block diagram 700 illustrating an exemplary NAND flash memory array adding bit line capacitors in accordance with one embodiment of the present invention. Bit line capacitors can be added to each bit line to increase data holding time of the bit line voltages during the MPS operation. Diagram 700, which is similar to the device 300 shown in FIG. 3, includes enable transistors 710-712, and bit line capacitors 714-716. The bit lines BL0-BLk of the array are coupled to bit line capacitors 714-716. The enable transistors 710-712 are coupled to the source nodes of the bit line capacitors 714-716. In an embodiment, the enable transistors 710-712 are NMOS transistors. The NMOS transistors 710-712 may also be replaced by PMOS or P-N-pair transistors to improve holding capability for both 0V and VDD signals. The bit line capacitors 714-716 include any type of capacitors such as PIP (Poly-Interpoly-Poly) capacitors, MIM (Metal insulator Metal) capacitors, NMOS capacitors, PMOS capacitors, and the like.

In one operation, during bit line voltage loading, a control signal EN can be driven high to turn on the enable transistors 710-712. The turn-on enable transistors 710-712 function to add the bit line capacitors 714-716 to the bit lines BL0-BLk. During a read operation, the signal EN can be driven low to turn off the enable transistors 710-712, thereby allowing the source of the bit line capacitors 714-716 to become floating.

Figure 8:
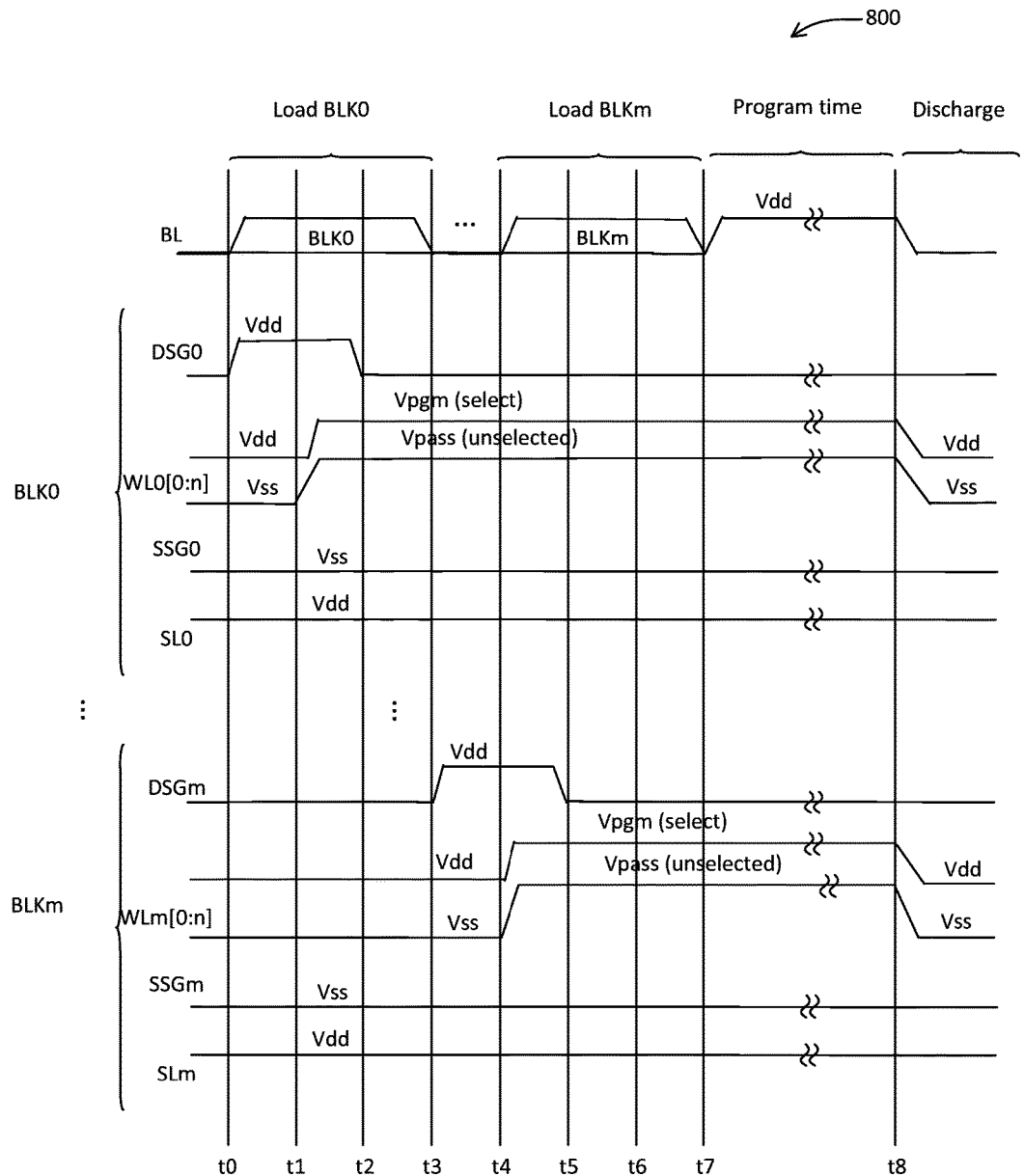
FIGS. 8-11B are clock waveform diagrams illustrating MPS operations in accordance with one embodiment of the present invention.

FIG. 8 is a clock waveform diagram 800 illustrating an MPS operation in accordance with one embodiment of the present invention. The clock waveform diagram 800 illustrates a bit line waveform BL, a first block waveform BLK0, and a second block waveform BLKm. In one embodiment, the first block waveform BLK0 includes drain select gate signal DSG0, word line signals WL0[0:n], source select gate signal SSG0 and source line signal SL0. The second block waveform BLKm includes drain select gate signal DSGm, word line signals WLm[0:n], source select gate signal SSGm and source line signal SLm. The clock waveforms BL, BLK0, BLKm illustrate an MPS operation using systems, devices, and/or architectures illustrated in FIG. 1 through FIG. 7.

Referring back to FIG. 8, the diagram shows an exemplary waveform associated to various signals such as BL DSG0, WL0[0:n], SSG0, and SL0 in accordance with an MPS operation. First, the page buffer loads the bit line or BL voltages to the cell string of the BLK0. At the t0 time period, the bit lines for programming and inhibit are applied with 0V and VDD, respectively. The DSG0 is applied with VDD to let the bit line voltages to enter the BLK0's cell string. The SSG0, at t0, is set to 0V to turn off the source select gate or SSG and the SL0 is set to VDD. At t1 time period, the selected WL in the BLK0 is ramped up to a high voltage, Vpgm (programming voltage), such as 18-20V for programming, and all the unselected WLs in BLK0 are ramped to a medium high voltage, Vpass (passing voltage), such as 8-10V. Note that Vpass maintains the channel region of all the unselected WLs' cells to a medium high voltage ("Vmh") around 7-8V by self-channel-boosting. Depending on the applications, WL can ramp up to Vpgm from VDD or Vss. Vss, for example, can be zero (0) volt, ground, and/or negative voltages based on the applications.

For the bit lines that are applied with 0V, the channel region's voltage will be discharged to 0V through the DSG0 to the bit lines. Zero voltage at BL causes high electric field between the selected WL and the channel region, thus causes electrons to inject from the channel region into the floating gate by 'Fowler-Nordheim Tunneling' mechanism. Injection to the floating gate increases the cell's threshold voltage (Vt) thus the cell is programmed to an off-cell (data '0'). For other bit lines that are applied with VDD, the DSG0 is turned off thus the charge coupled by the WL trapped inside the channel region. The channel region thus remains the medium high voltage 7-8V. The medium high voltage reduces the electric field between the selected WL and the channel region, so electrons will not inject into the floating gate and the cell remains at low Vt and read as an on-cell (data '1'). The channel regions, in one example, are referred to NAND flash memory strings wherein each string includes multiple transistors arranged in a channel-like serial connection between the sources terminals and drain terminals.

After the BLK0's channel region voltages are set to either 0V or 7-8V, the DSG0 is switched to 0V to turn off the drain select gates of BLK0. Once the DSG0 is turned off, the channel region of BLK0 will remain the same 0V or 7-8V, and the voltage is 'trapped' inside the channel region. In one aspect, the channel is able to trap both 0V for programmed bit line or 7-8V for inhibit bit lines. It should be noted that the channel voltage will gradually leak away through cells' P-N junction leakage. For a channel to dissipate or leak away 1V through the P-N junction can take 50 to 100 ms.

Since the junction leakage current is generally 1 pA (picoampere) range and the junction capacitance of the entire cell string has 10 to 100 fF (femtofarad) range, it may take between 10 ms and 100 ms to leak away 1V. Since each program pulse is approximately 30 μs, the channel voltage will remain almost no change during the entire program pulse. After DSG0 goes to 0V to trap the program and inhibit voltages in the channel region of BLK0, the bit lines voltages can be changed without affecting the BLK0.

The second page buffer's data are subsequently applied to the bit lines and the same voltage setup sequence as above-described relating to BLK0 is repeated for BLK1. The BLK1's DSG1 is applied with VDD to allow the bit line voltages enter the cell string of the BLK1. The selected word line in BLK1 is pulled up to 18-20V and the unselected word lines in BLK1 are applied with 8-10V to couple the channel regions to 0V or 7-8V according to the bit lines voltages. DSG1 subsequently goes to 0V to isolate the channel region of BLK1, and then the next page buffer's data can be applied to the bit lines and loaded to the next block. This sequence can be repeated for multiple blocks until all the page buffers' data are loaded.

After all the page buffers' data are loaded and trapped inside the channel region of multiple blocks, a timing control circuit counts the program pulse, such as 30 μs, as shown in t7-t8 time periods in FIG. 8. Since all the selected pages are programmed simultaneously, the overall programming time is drastically reduced. It should be noted that during the program time, all the bit lines can be 0V, VDD, or floating because the DSG of all the blocks are turned off. In an alternative embodiment, VDD or voltage higher than VDD is applied to all the bit lines to reduce the voltage stress of the DSG which may also reduce the punch-through leakage current of DSG.

During an MPS operation, loading multiple page buffers' data to multiple blocks generally takes 1 or less than 1 μs. Compared with 30 μs program pulse, loading time from page buffer to blocks is small. To ramp up the selected word line, the steps or three steps such as VDD, 10V, and then 18-20V can be used to ramp up the WLs. It should be noted that although the above description and FIG. 8 shows individual SSG0-SSGm and SL0-SLm for each block, the array can use common SSG or common SL for all the blocks.

Figure 9A:
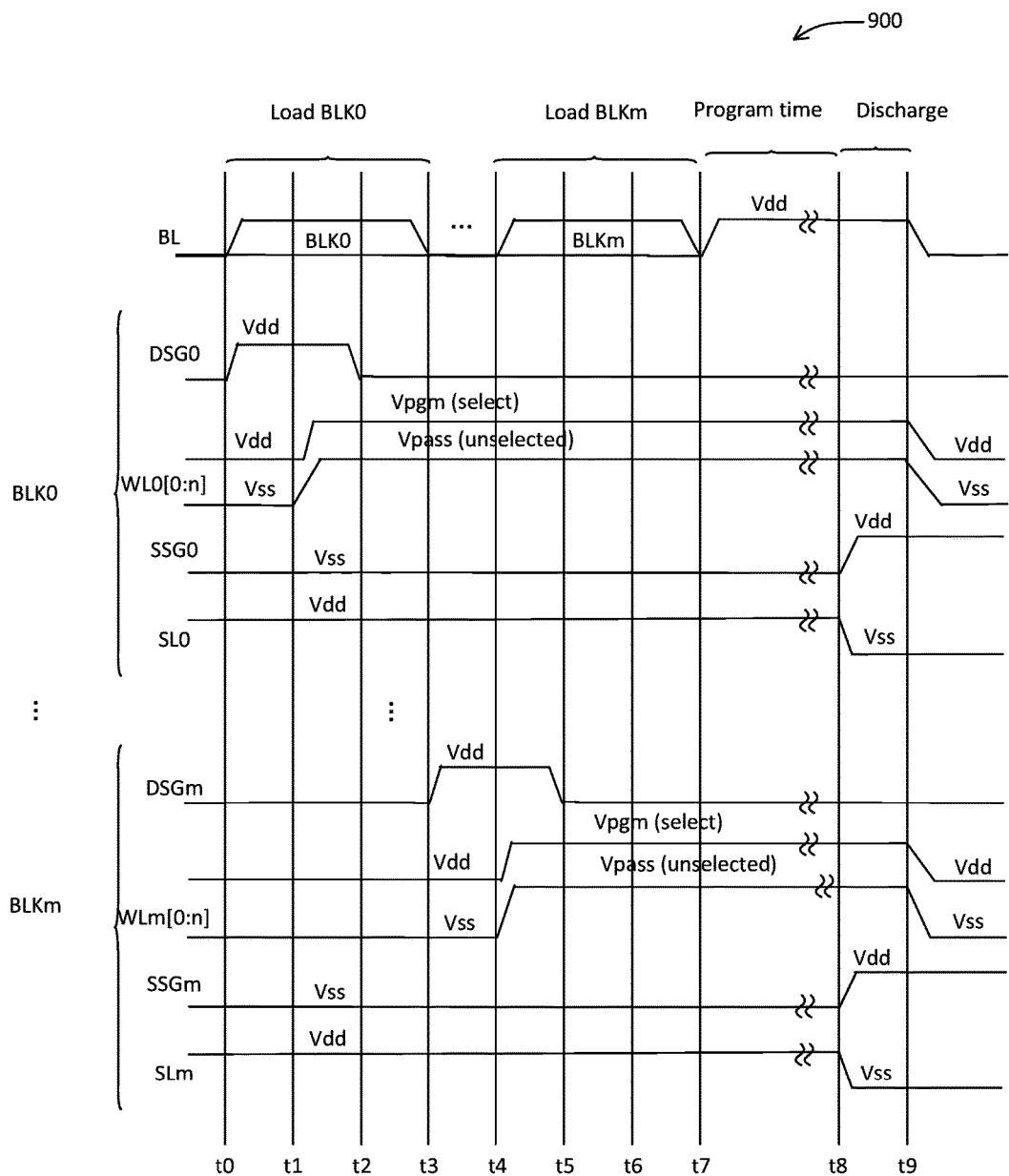

FIG. 9A is a clock waveform diagram 900 illustrating an alternative MPS operation in accordance with one embodiment of the present invention. The clock diagram 900 is similar to the clock diagram 800 shown in FIG. 8 except that the waveforms of SSG and SL are different at t8 time period. At t8, SSG0-SSGm are applied with VDD, and SL0-SLm are all applied with 0V. The word lines are subsequently discharged one after one according to the sequence from WL0 (near the DSG side) to WLn (near the SSG side). To maintain SSG at VDD and SL at 0V should push hot carriers in the channel to SL whereby the cells reliability in general can be improved.

It should be noted that although the above description of embodiment applies VDD to the bit lines and source lines during the data loading and program operation, it is not necessary to limit the voltage at VDD. Any voltage higher than VDD can also be applied to the bit lines and source lines without affecting performance of MPS operation. For example, the page buffer and source line circuit may use high-voltage device to sustain the voltage higher than VDD. Note that self-channel-coupling program-inhibit works well for VDD from 3V to 5V. However, when VDD is below 2V, the channel's initial voltage is too low (<1V), thus the coupled voltage may not be high enough to effectively inhibit the programming. To handle low VDD, the selected block channel region may be applied with a higher initial voltage before the channel coupling takes place.

Figure 9B:
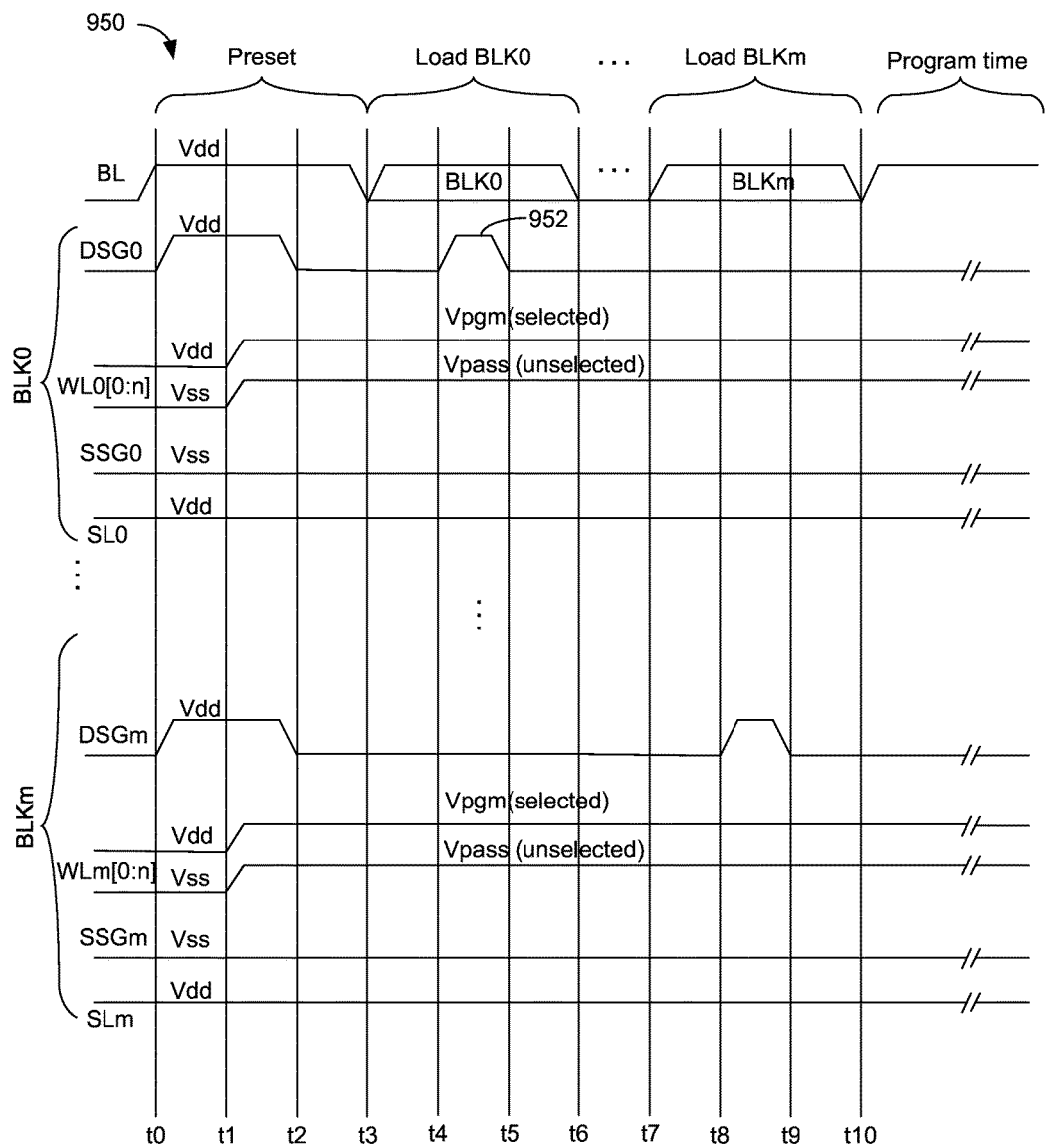

FIG. 9B is a clock waveform diagram 950 illustrating an alternative MPS operation in accordance with one embodiment of the present invention. The clock diagram 950 is similar to the clock diagram 900 shown in FIG. 9A except that the diagram 950 includes a preset cycle. During t0-t2, all the cell strings of BLK0-BLKm are 'PRESET' to the 'INHIBIT' condition by applying VDD to the bit lines, and all the drain select gates DSG0-DSGm to pass VDD voltage from the bit lines to all the BLK0-BLKm's cell strings. At t1 time, all the word lines, WL0[0:n]-WLm[0:n], are ramped up to Vpgm and Vpass together. Because all the cell strings are preset to inhibit condition, none of the cell strings will be programmed at this time. At t3-t6, the bit line is applied with the data for BLK0 and the drain select gate DSG0 is applied with a pulse 952 to load the data into BLK0's cell string. The similar sequence is repeated to load all the data for BLK0-BLKm. At t10, the cell strings of BLK0-BLKm are programmed together to save the programming time.

Figure 10:
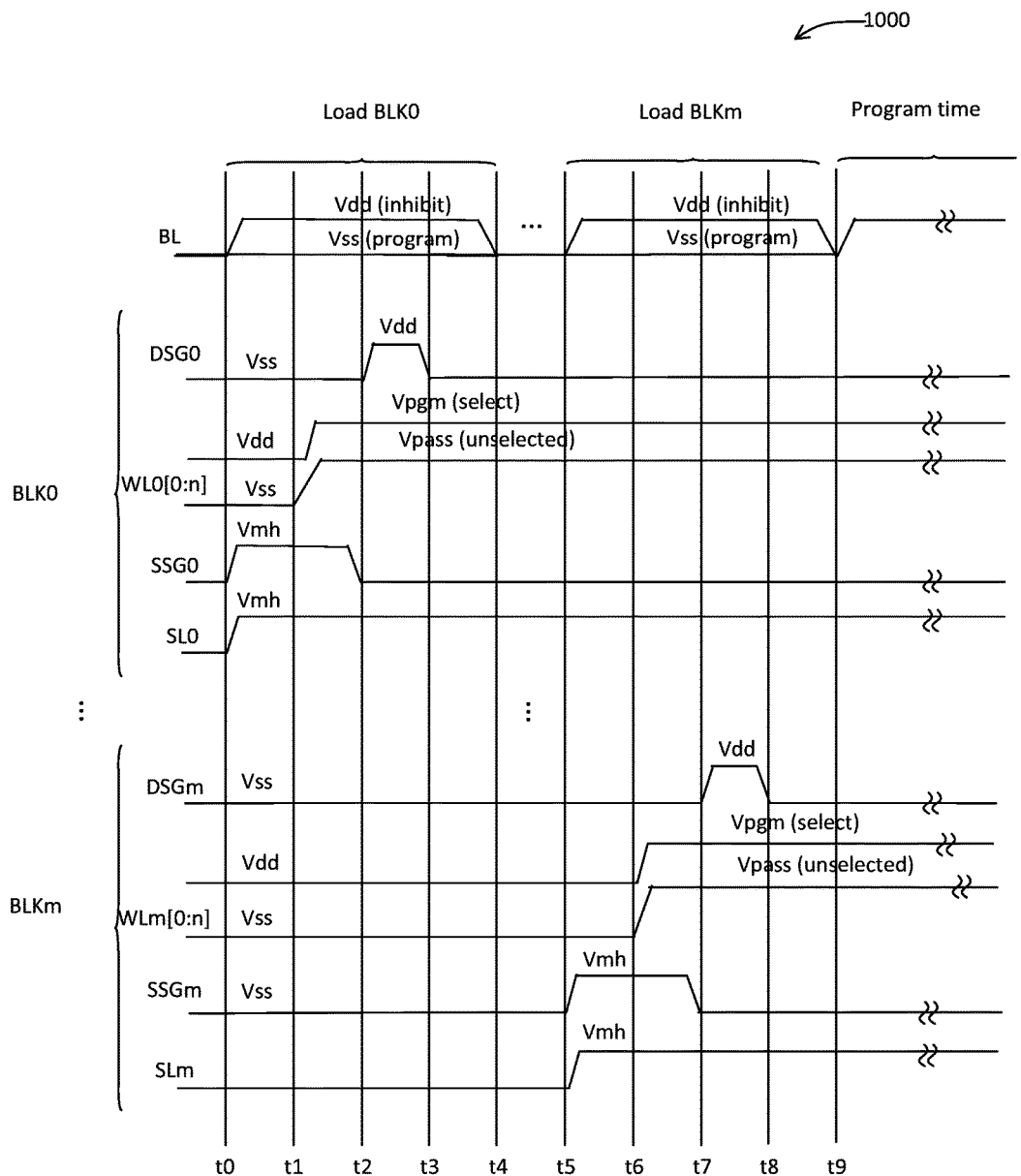
Figure 11A:
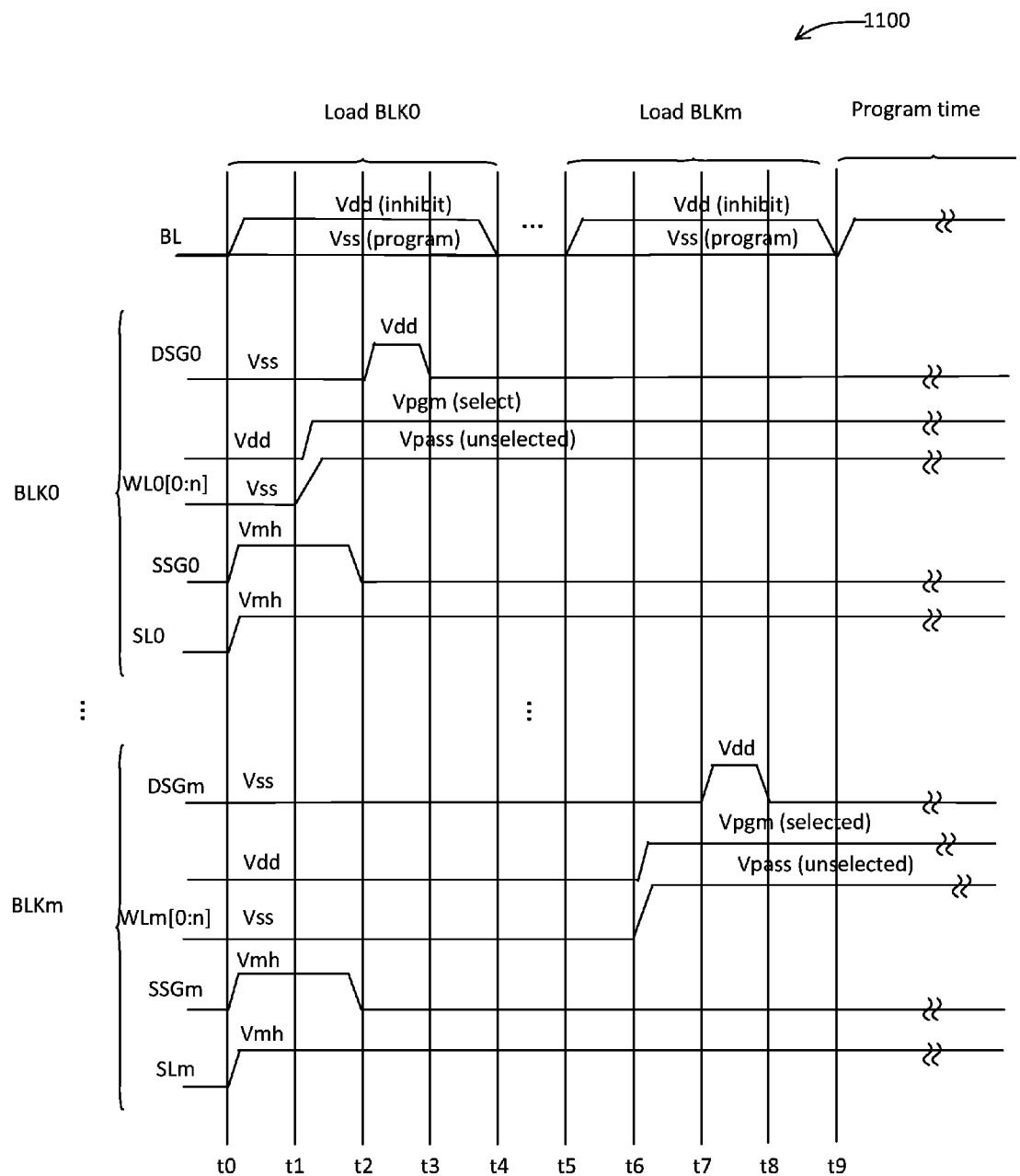

FIG. 10 and FIG. 11A are clock waveforms diagram 1000 and 1100 illustrating an alternative MPS operation in accordance with one embodiment of the present invention. The clock waveform diagram 1000 or 1100 is similar to the clock waveform diagram 800 shown in FIG. 8 except that the waveforms of DSG and SSG are different at t1 and t2. At t0 time, the first selected block, BLK0's SGS0 and SL0 are applied with a medium high voltage (Vmh) such as 4-5V. Application of medium high voltage will charge the cell string's channel region to 2-3V depending on the on-cell's Vt. At t1 time, the selected WL and unselected WLs are ramped to Vpgm (18-20V) and Vpass (8-10V), respective, to couple the cells' channel region to 7-8V. The SGS0 then is pulled low to 0V to turn off the source select gates. The DSG0 is driven to VDD to turn on the drain select gates, and the channel region is discharged to 0V if the bit lines are applied with 0V, or remain the coupled 7-8V if the bit lines are applied with VDD. After the channel voltages are set, the DSG0 goes to 0V to turn off the drain select gates and isolate the BLK0 from bit lines. The next page buffer's data can be applied to bit lines, and the next select block's channel voltages can be set. This operation can be repeated to load multiple blocks. After all the page buffers' data are loaded to the selected blocks, the program time can start.

It should be noted that if the array uses individual SSG0-SSGm and SL0-SLm, each block's channel initial voltage can be set block by block as shown in FIG. 10. However, if the array uses common SSG and SL, it can pull the common SSG and SL to Vmh at t0 time to charge all the blocks' channel region, and then pull low common SSG to 0V at t2 time, as shown in FIG. 11A. This will cause the initial voltage charged from SL to be trapped in the channel region, to allow the selected blocks' word lines perform self-channel-boosting inhibit.

FIG. 10 further illustrates that the SSG0 or SSGm goes low after the word lines ramp to Vpgm or Vpass. According to another embodiment of the invention, the SSG0-SSGm can go low to 0V before the word lines ramp to Vpgm or Vpass. Since the channel voltage is trapped after SSG0-SSGm go low, the self-channel-boosting inhibit will work well in this embodiment as well. According to FIG. 10, the DSG0 or DSGm goes high after the word lines ramp to Vpgm or Vpass. Alternatively, the DSG0-DSGm can go to VDD (high) before the word lines ramp to Vpgm or Vpass. SSG, however, should go low before DSG goes high, otherwise it will cause leakage current from SL to BL that are applied with 0V.

Figure 11B:
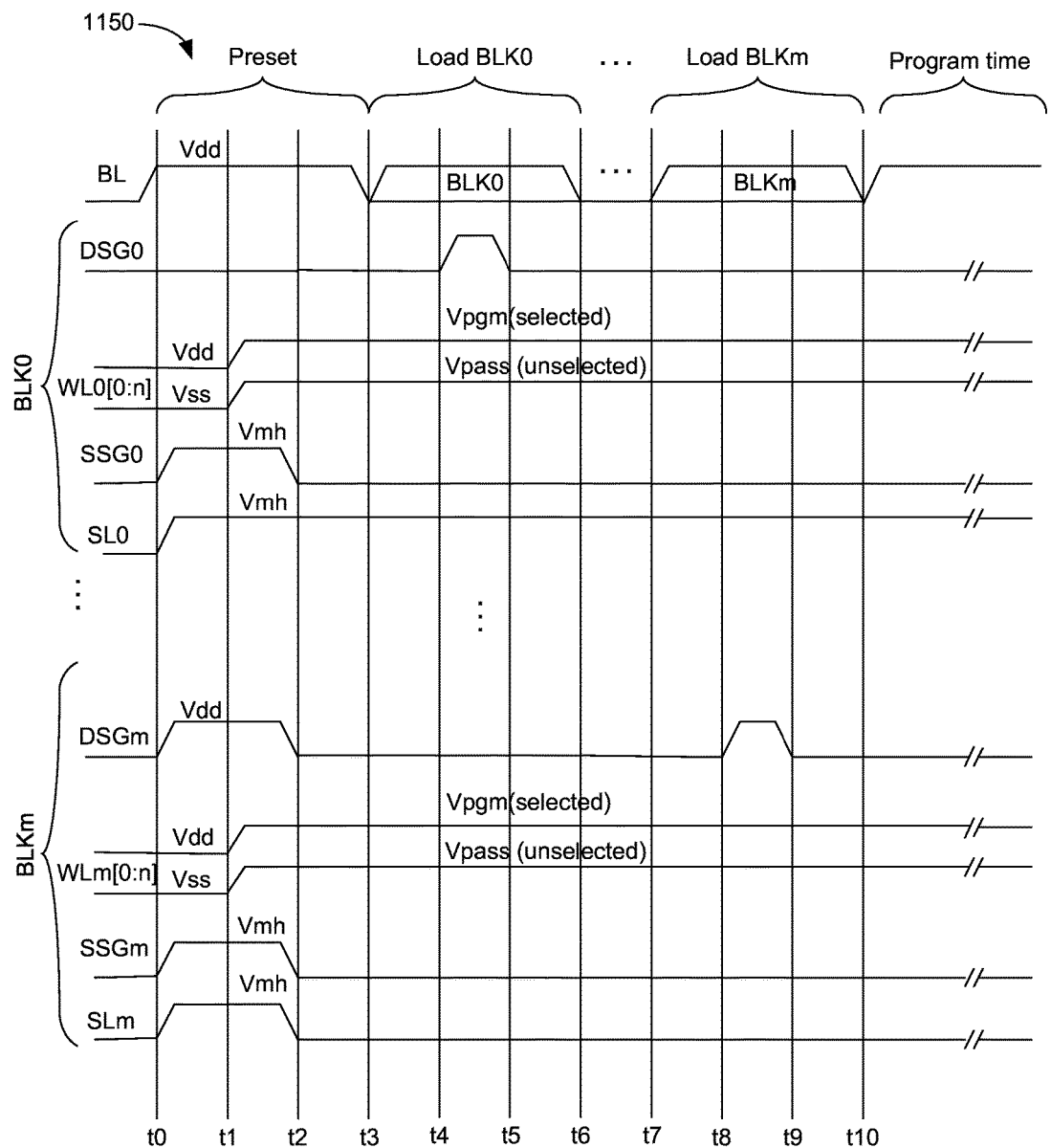

FIG. 11B is a clock waveform diagram 1150 illustrating an alternative MPS operation in accordance with one embodiment of the present invention. The clock diagram 1150 is similar to the clock diagram 950 shown in FIG. 9B except that the waveforms of SSG and SL are different. During t0-t2, the cell strings of BLK0-BLKm are preset to the inhibit condition by source select gates SSG0-SSGm and source lines SL0-SLm, rather than the drain select gates DSG0-DSGm and bit lines as shown in FIG. 9B. The SSG0-SSGm and SL0-SLm are applied with a medium high voltage (Vmh) which may be VDD or other voltage higher than VDD.

The exemplary aspect of the present invention includes various processing steps, which will be described below. The steps of the aspect may be embodied in machine or computer executable instructions. The instructions can be used to direct a general purpose or special purpose system, which is programmed with the instructions, to perform the steps of the exemplary aspect of the present invention. Alternatively, the steps of the exemplary aspect of the present invention may be performed by specific hardware components that contain hard-wired logic for performing the steps, or by any combination of programmed computer components and custom hardware components.

Figure 12:
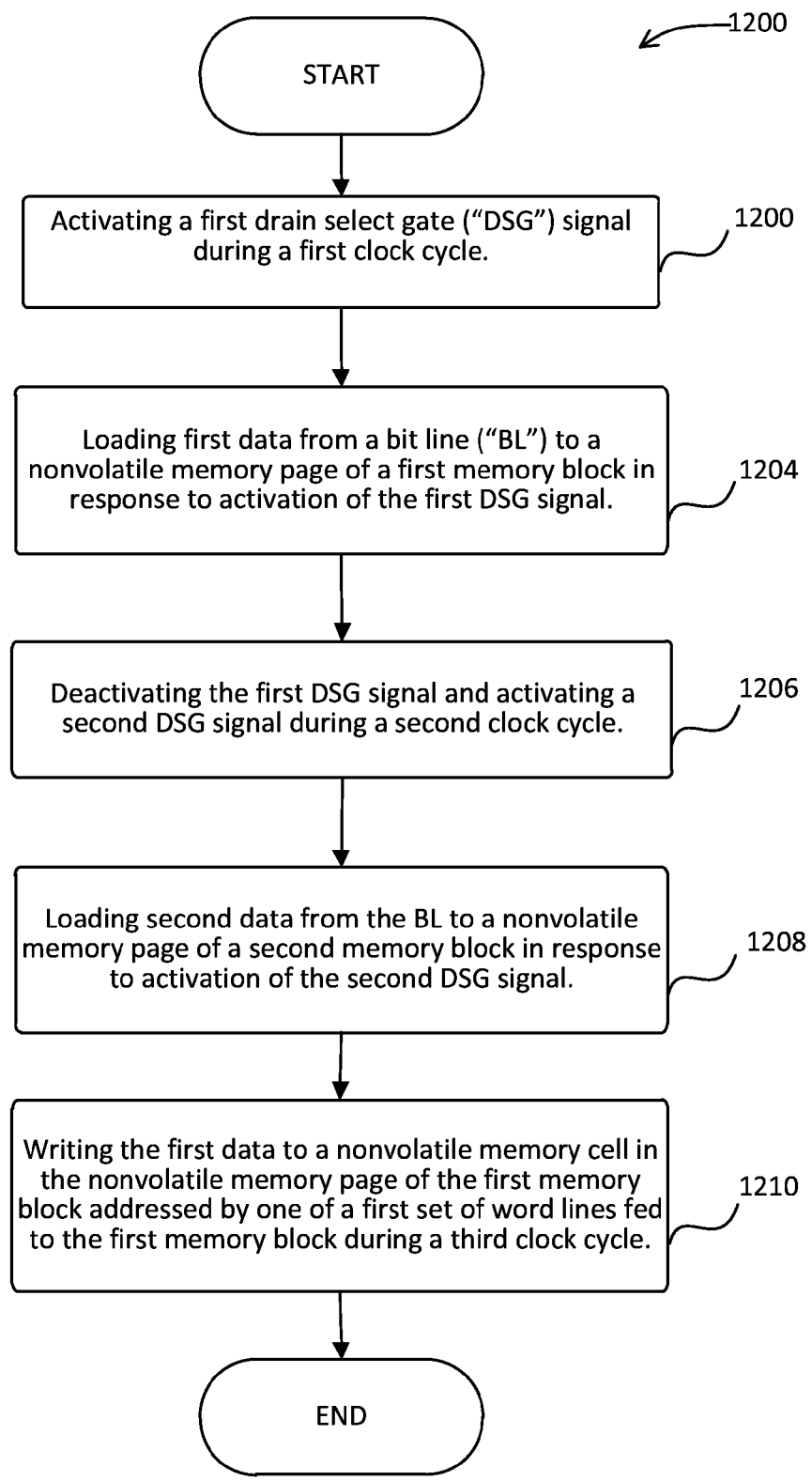
FIG. 12 is a flow chart illustrating a process for an MPS in accordance with one embodiment of the present invention.

FIG. 12 is a flow chart 1200 illustrating a process for an MPS in accordance with one embodiment of the present invention. At block 1202, the process of MPS activates a first DSG signal a first clock cycle. In one embodiment, activating a first DSG signal includes driving a high voltage on a first source line for multiple clock cycles while maintaining a low voltage on a first source select gate for multiple clock cycles.

At block 1204, first data from a bit line ("BL") is loaded to a nonvolatile memory page of a first memory block in response to activation of the first DSG signal. In one aspect, loading first data from the BL to the nonvolatile memory page includes pushing data from the BL to NAND nonvolatile memory cells organized in a string.

At block 1206, the first DSG signal is deactivated and a second DSG signal is subsequently activated during a second clock cycle. In one embodiment, deactivating the first DSG signal and activating a second DSG signal includes logically disconnecting the BL from the nonvolatile memory page of the first memory block.

At block 1208, second data from the BL is loaded to a nonvolatile memory page of a second memory block in response to activation of the second DSG signal. In one embodiment, the process is capable of injecting data from the BL to NAND nonvolatile memory cells which are organized in a string configuration. After the second DSG signal is deactivated, the process activates a third DSG signal and a third data is subsequently loaded from the BL to a nonvolatile memory page of a third memory block in response to activation of the third DSG signal.

At block 1210, the first data is written to a nonvolatile memory cell in the nonvolatile memory page of the first memory block addressed by one of a first set of word lines ("WLs") fed to the first memory block during a third clock cycle. The second data is programmed into a nonvolatile memory cell in the nonvolatile memory page of the second memory block addressed by one of a second set of WLs fed to the second memory block during the third clock cycle. The third data is written to a nonvolatile memory cell in the nonvolatile memory page of the third memory block addressed by one of a third set of WLs fed to the third memory block. Note that programming first data, second data, and third data into their corresponding nonvolatile memory cells can occur concurrently. Also, the process of programming first data, second data, and third data into their corresponding nonvolatile memory cells can occur in a cascade sequence. The cascade sequence refers to when the second data begins to be written into its corresponding memory cells while the first data is still being written into its corresponding memory.

Figure 13:
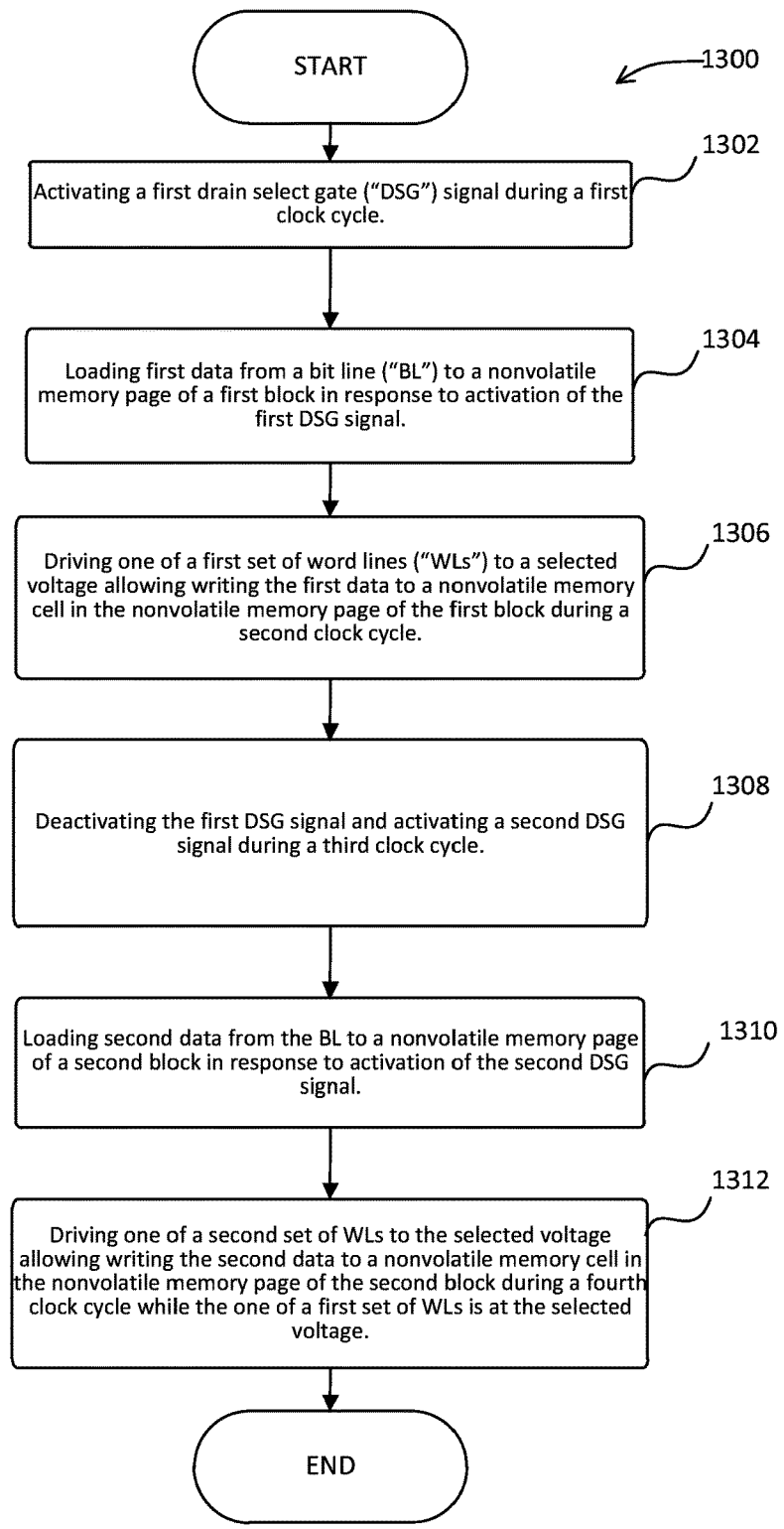
FIG. 13 is a flow chart illustrating an alternative process of MPS in accordance with one embodiment of the present invention.

FIG. 13 is a flow chart 1300 illustrating an alternative process of MPS operation in accordance with one embodiment of the present invention. At block 1302, the process activates a first DSG signal during a first clock cycle. In one example, a high voltage is driven onto a first source line for multiple clock cycles and maintaining a low voltage on a first source select gate for multiple clock cycles.

At block 1304, a first data is loaded from a BL to a nonvolatile memory page of a first block in response to the activation of the first DSG signal. In one aspect, loading first data from the BL to the nonvolatile memory page of the first memory block includes pushing data from the BL to NAND nonvolatile memory cells organized in a string. Alternatively, after loading the first data from the BL to the nonvolatile memory page of the first memory block, the data from the BL is pushed to metal-oxide-semiconductor ("PMOS") based nonvolatile memory cells organized in a string.

At block 1306, one of a first set of WLs is driven to a selected voltage allowing writing the first data to a nonvolatile memory cell in the nonvolatile memory page of the first block during a second clock cycle.

At block 1308, the first DSG signal is deactivated and a second DSG signal is activated during a third clock cycle.

At block 1310, a second data is loaded from the BL to a nonvolatile memory page of a second block in response to activation of the second DSG signal.

At block 1312, one of a second set of WLs is driven to the selected voltage allowing writing the second data to a nonvolatile memory cell in the nonvolatile memory page of the second block during a fourth clock cycle while the one of a first set of WLs is at the selected voltage. In one example, the process further includes deactivating the second DSG signal and activating a third DSG signal during the fifth clock cycle and loading third data from the BL to a nonvolatile memory page of a third block in response to activation of the third DSG signal. Alternatively, the method further includes driving one of a third set of WLs to the selected voltage allowing writing the third data to a nonvolatile memory cell in the nonvolatile memory page of the third block during a sixth clock cycle while the one of the first set of WLs and the one of the second set of WLs are at the selected voltage.

Figure 14:
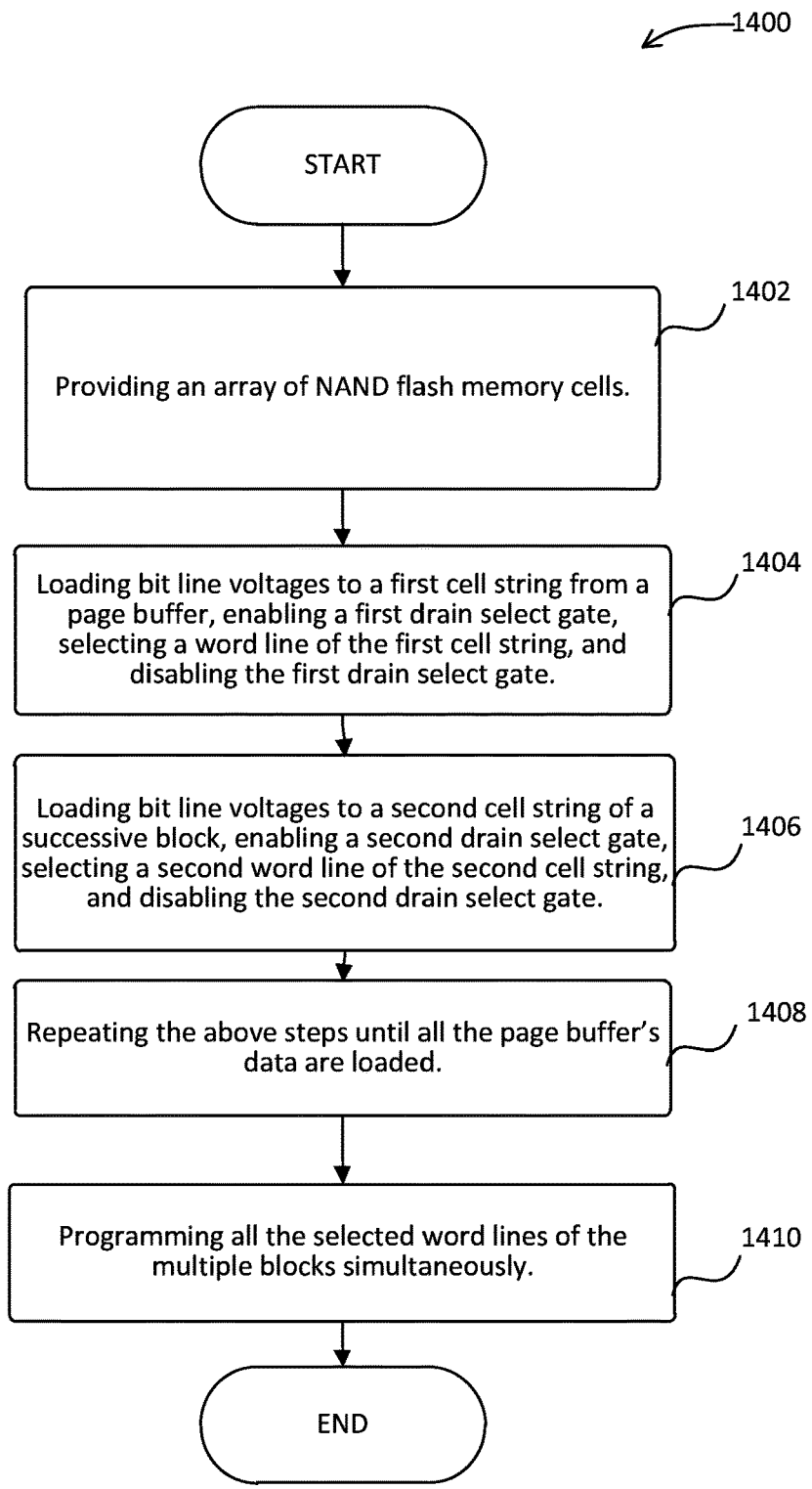
FIG. 14 is a flow chart illustrating an alternative process of MPS in accordance with one embodiment of the present invention.

FIG. 14 is a flow chart 1400 illustrating an exemplary process operating MPS in accordance with one embodiment of the present invention. At block 1402, an array of NAND flash memory cells is provided.

At block 1404, once the bit line voltages are loaded to a first cell string from a page buffer, a first DSG is enabled. After selecting a WL of the first cell string, the first DSG is disabled. In one embodiment, the loading bit line voltages to the first cell string of the first block includes loading the bit line voltages to the first cell string of the first block from the page buffer by applying a program/inhibit signal to a bit line of the first cell string, enabling the first drain select gate of the first cell string, applying a source select gate of the first cell string with Vss and applying a source line of the first cell string with VDD, ramping the selected word line of the first cell string with a high voltage for programming (Vpgm) and ramping all the unselected word lines with a medium high voltage (Vpass), thereby coupling the channel region of the first cell string to a medium high voltage, and disabling the drain select gate of the first cell string, thereby trapping the voltage for both a programmed bit line and an inhibited bit line in the channel region of the first cell string.

In another embodiment, the method further includes applying the source select gate and the source line of the first cell string with a medium high voltage (Vmh) before ramping the selected word line of the first cell string with a high voltage for programming (Vpgm) and ramping all the unselected word lines with a medium high voltage (Vpass) and applying Vss to the source select gate of the first cell string before enabling the first drain select gate of the first cell string. Alternatively, the method further includes providing an array of NAND flash memory cells comprising common source select gates and common source lines for every memory cell string, applying the source select gate and the source line of all the flash memory cells with a medium high voltage (Vmh) before ramping the selected word line of the first cell string with a high voltage for programming (Vpgm) and ramping all the unselected word lines with a medium high voltage (Vpass) and applying Vss to the source select gate of all the flash memory cells before enabling the first drain select gate of the first cell string.

At block 1406, bit line voltages are loaded to a second cell string of a successive block from the page buffer, a second drain select gate is enabled, a second word line of the second cell string is selected, and the second drain select gate is disabled.

At block 1408, the above steps are repeated until the page buffer's data are loaded.

At block 1410, all the selected word lines of the multiple blocks are programmed simultaneously. In one aspect, the number of multiple blocks programmed simultaneously is eight. Alternatively, the method can further include discharging a channel region of all the cell strings by applying Vss to the word lines of all the cell strings. In one embodiment, discharging the channel region can include discharging a channel region of all the cell strings by first applying VDD to a source select gate of all the cell strings, applying Vss to all the source lines of all the cell strings, and applying Vss to the word lines of all the cell strings. In another aspect, programming all the selected word lines of the multiple blocks simultaneously includes counting a program pulse with a timing control circuit for programming all the selected pages of the multiple blocks simultaneously.

Figure 15:
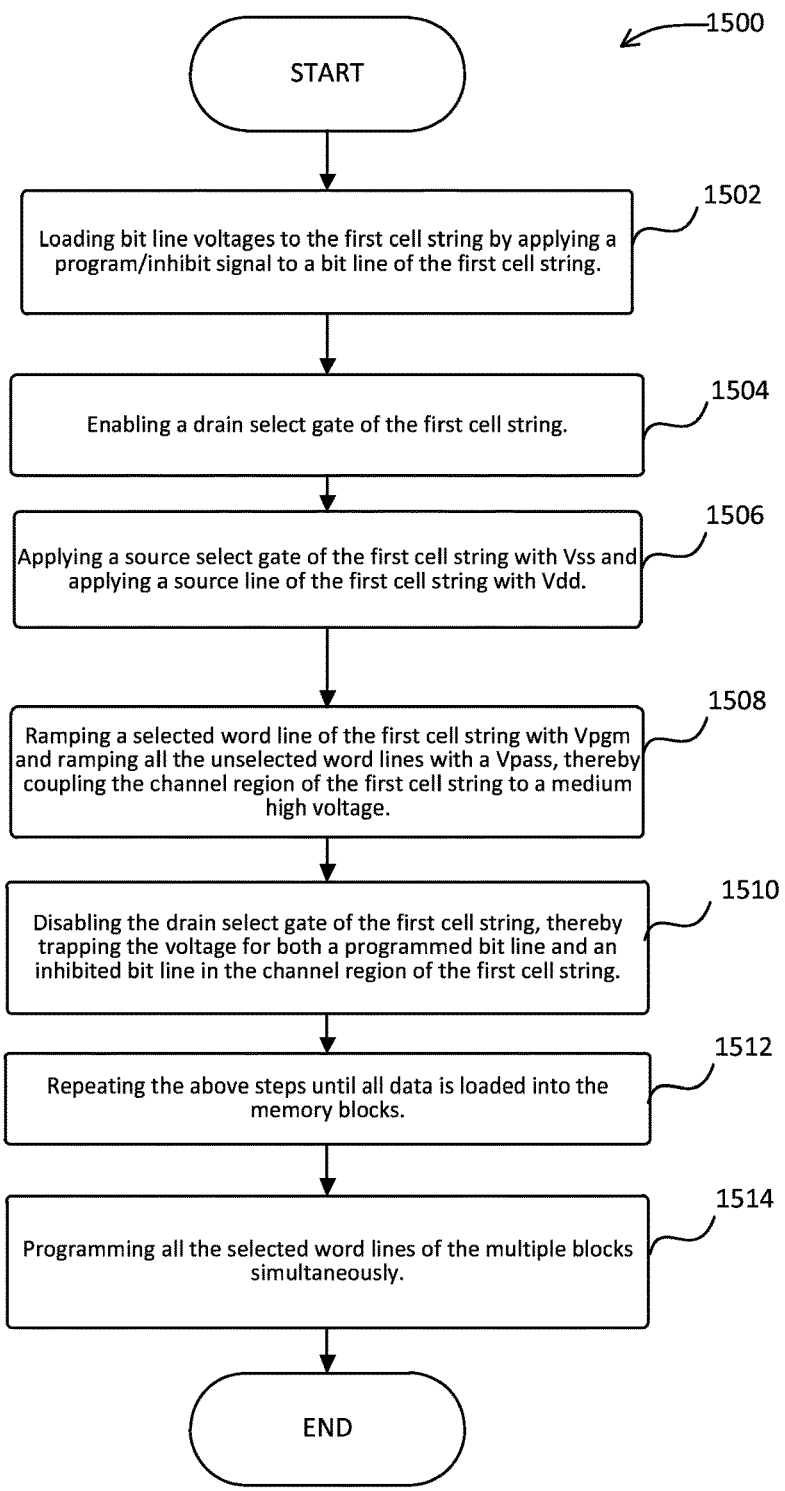
FIG. 15 is a flow chart illustrating another alternative example of an MPS operation in accordance with one embodiment of the present invention.

FIG. 15 is a flow chart 1500 illustrating another alternative example of an MPS operation in accordance with one embodiment of the present invention. At block 1502, bit line voltages are loaded to the first cell string by applying a program/inhibit signal to a bit line of the first cell string.

At block 1504, a DSG of the first cell string is enabled, and a SSG of the first cell string, at block 1506, is applied with Vss and a source line of the first cell string is applied with VDD.

At block 1508, a selected word line of the first cell string is ramped with Vpgm and the unselected word lines are ramped with a Vpass, thereby coupling the channel region of the first cell string to a medium high voltage.

At block 1510, the drain select gate of the first cell string is disabled, thereby trapping the voltage for both a programmed bit line and an inhibited bit line in the channel region of the first cell string. In one aspect, the method further includes discharging a channel region of all the cell strings by applying Vss to the word lines of all the cell strings. In one embodiment, discharging the channel region includes discharging a channel region of all the cell strings by first applying VDD to a source select gate of all the cell strings, applying Vss to all the source lines of all the cell strings, and applying Vss to the word lines of all the cell strings.

At block 1512, the above steps are repeated until all data is loaded into the memory blocks.

At block 1512, all the selected word lines of the multiple blocks are programmed simultaneously. In one aspect, the number of multiple blocks programmed simultaneously is eight. Alternatively, the method can further include discharging a channel region of all the cell strings by applying Vss to the word lines of all the cell strings. In one embodiment, discharging the channel region can include discharging a channel region of all the cell strings by first applying VDD to a source select gate of all the cell strings, applying Vss to all the source lines of all the cell strings; and applying Vss to the word lines of all the cell strings. In another aspect, programming all the selected word lines of the multiple blocks simultaneously includes counting a program pulse with a timing control circuit for programming all the selected pages of the multiple blocks simultaneously.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A method of storing information in a nonvolatile memory device, comprising:
   presetting a plurality of cell strings associated with a plurality of memory blocks of the memory device to an inhibit condition by setting a bit line associated with the cell strings to an inhibit voltage level and then pulsing a plurality of drain select gates associated with the plurality of cell strings to pass the inhibit voltage level to the cell strings;
   ramping up a selected word line for each of the plurality of memory blocks to a program voltage level;
   ramping up unselected word lines of the plurality of memory blocks to a pass voltage level; and
   repeating multiple programming operations while maintaining the word line voltage levels from a first programming operation to a last programming operation, wherein the multiple programming operations program two or more memory blocks, and wherein each programming operation comprises:

applying data to a selected bit line; and
pulsing a drain select gate (DSG) associated with a selected memory block to load the data on the selected bit line into the selected memory block.

2. The method of claim 1, further comprising:
applying additional data to the bit lines; and
pulsing a DSG associated with a next selected memory block to load the additional data on the bit lines into the next selected memory block.

3. The method of claim 1, further comprising repeating the operations of applying and pulsing for each of one or more additional memory blocks until the plurality of memory blocks have been loaded.

4. The method of claim 3, wherein when the operation of repeating is completed the plurality of memory blocks are programmed substantially simultaneously.

5. The method of claim 1, wherein the operation of presetting comprises:
applying VDD to all bit lines of the plurality of memory blocks; and
applying VDD to all drain select gates of the plurality of memory blocks.

6. The method of claim 1, wherein the ramping up of the selected word line and the ramping up of the unselected word lines is performed substantially together.

7. The method of claim 1, wherein the pulsing comprises:
increasing a voltage level on the drain select gate to Vdd; and
reducing the voltage level on the drain select gate to Vss after a selected time interval has expired.

8. The method of claim 1, wherein each memory block comprises a cell string having a plurality of NAND nonvolatile memory cells.

9. A nonvolatile memory device, comprising:
an array of flash memory cells organized in multiple memory blocks, wherein each of the multiple memory blocks is further arranged in a plurality of pages having cell strings; and
multiple block decoders coupled to the multiple memory blocks, and wherein the multiple block decoders perform operations of:
presetting a plurality of cell strings associated with a plurality of memory blocks of the memory device to an inhibit condition by setting a bit line associated with the cell strings to an inhibit voltage level and then pulsing a plurality of drain select gates associated with the plurality of cell strings to pass the inhibit voltage level to the cell strings;
ramping up a selected word line of the plurality of memory blocks to a program voltage level;
ramping up unselected word lines of the plurality of memory blocks to a pass voltage level;
applying selected data to a selected bit line;
pulsing a drain select gate (DSG) associated with a selected memory block to load the data on the selected bit line into the selected memory block; and
repeating the operation of pulsing to program multiple memory blocks while maintaining the word line voltage levels from a first programming operation to a last programming operation.

10. The apparatus of claim 9, wherein the multiple block decoders perform operations of:
applying additional data to the bit lines; and
pulsing a DSG associated with a next selected memory block to load the additional data on the bit lines into a next selected memory block.

11. The apparatus of claim 9, wherein the multiple block decoders repeat the operations of applying and pulsing for each of one or more additional memory blocks until the plurality of memory blocks have been loaded.

12. The apparatus of claim 11, wherein when the multiple block decoders complete the operation of repeating, the plurality of memory blocks are programmed substantially simultaneously.

13. The apparatus of claim 9, wherein the multiple block decoders perform the operation of presetting by:
applying VDD to all bit lines of the plurality of memory blocks; and
applying VDD to all drain select gates of the plurality of memory blocks.

14. The apparatus of claim 9, wherein multiple block decoders perform the ramping up of the selected word line and the ramping up of the unselected word lines substantially together.

15. The apparatus of claim 9, wherein the pulsing comprises:
increasing a voltage level on the drain select gate to Vdd; and
reducing the voltage level on the drain select gate to Vss after a selected time interval has expired.

16. The apparatus of claim 9, wherein each memory block comprises a cell string having a plurality of NAND nonvolatile memory cells.

17. A method for programming a nonvolatile memory device, the method comprising:
setting selected word lines of a plurality of memory blocks to a program voltage level and remaining word lines to a pass voltage level;
pulsing a drain select gate (DSG) associated with a first memory block to program bit line data into the first memory block;
pulsing a drain select gate (DSG) associated with a second memory block to program the bit line data into the second memory block; and
maintaining the voltage levels of word lines associated with the first and second memory blocks beginning from the pulsing of the DSG associated with the first memory block to the pulsing of the DSG associated with the second memory block.

* * * * *